(12) United States Patent
Otto et al.

(10) Patent No.: US 8,195,260 B2
(45) Date of Patent: Jun. 5, 2012

(54) TWO-SIDED SPLICE FOR HIGH TEMPERATURE SUPERCONDUCTOR LAMINATED WIRES

(75) Inventors: Alexander Otto, Chelmsford, MA (US); Peter D. Antaya, Sutton, MA (US); John P. Voccio, West Newton, MA (US); Henry C. Valcour, Upton, MA (US)

(73) Assignee: American Superconductor Corporation, Devens, MA (US)

( * ) Notice: Subject to any disclaimer, the term of this patent is extended or adjusted under 35 U.S.C. 154(b) by 912 days.

(21) Appl. No.: 12/178,469

(22) Filed: Jul. 23, 2008

(65) Prior Publication Data
US 2010/0022396 A1 Jan. 28, 2010

(51) Int. Cl.
*H01L 39/24* (2006.01)
*H02G 15/08* (2006.01)

(52) U.S. Cl. ...... 505/220; 505/925; 505/926; 174/21 R; 403/404

(58) Field of Classification Search .......... 505/220, 505/231, 234, 237, 925, 926; 174/21 R, 174/73.1, 75 R, 84, 125.1; 439/492; 156/49; 403/404
See application file for complete search history.

(56) References Cited

U.S. PATENT DOCUMENTS

| | | | |
|---|---|---|---|
| 5,051,397 A | 9/1991 | Sato et al. | |
| 5,134,040 A * | 7/1992 | Benz et al. | 428/646 |
| 5,231,074 A | 7/1993 | Cima et al. | |
| 5,987,342 A | 11/1999 | Scudiere et al. | |
| 6,022,832 A | 2/2000 | Fritzemeier et al. | |
| 6,027,564 A | 2/2000 | Fritzemeier et al. | |
| 6,133,814 A | 10/2000 | Okada et al. | |
| 6,159,905 A | 12/2000 | Buzcek et al. | |
| 6,190,752 B1 | 2/2001 | Do et al. | |
| 6,436,317 B1 | 8/2002 | Malozemoff et al. | |
| 6,537,689 B2 | 3/2003 | Schoop et al. | |
| 6,745,059 B2 | 6/2004 | Buzcek et al. | |

(Continued)

FOREIGN PATENT DOCUMENTS
WO 01/011428 12/1998
(Continued)

OTHER PUBLICATIONS

Shoup, Shara S. "Epitaxial Thin Film Growth of Lanthanum and Neodymium Aluminate Films on Roll-Textured Nickel Using a Sol-Gel Method" *J. Am. Ceram. Soc* 81 [11] pp. 3019-3021 (1998).

(Continued)

*Primary Examiner* — Mark Kopec
(74) *Attorney, Agent, or Firm* — Occhiuti Rohlicek & Tsao LLP

(57) ABSTRACT

A two-sided joint for splicing two laminated wires together, while preserving the mechanical integrity of the wire is disclosed. The two-sided joint can splice two laminated HTS wires having tapered ends and includes a bottom strap and a top strap. Under one aspect, a laminated, spliced superconductor wire includes a superconductor joint, which includes first and second superconductor wires, each wire including a laminate layer, a substrate layer overlaying the laminate layer, a buffer layer overlaying the substrate layer, a superconductor layer overlaying the buffer layer, a gap layer overlaying the superconductor layer, and a laminate layer overlaying the gap layer, a first HTS strap in electrical connection with the second laminate layer of the first laminate wire and the second laminate layer of the second laminate wire, and a backing strap proximate to the first laminate layer.

45 Claims, 9 Drawing Sheets

U.S. PATENT DOCUMENTS

| | | | |
|---|---|---|---|
| 6,797,313 | B2 | 9/2004 | Fritzemeier et al. |
| 6,974,501 | B1 | 12/2005 | Zhang et al. |
| 7,071,148 | B1 | 7/2006 | Selvamanickam et al. |
| 7,463,915 | B2 | 12/2008 | Thieme et al. |
| 7,496,390 | B2 | 2/2009 | Thieme et al. |
| 7,582,328 | B2 | 9/2009 | Rupich et al. |
| 7,622,424 | B2 | 11/2009 | Li et al. |
| 7,816,303 | B2 | 10/2010 | Thieme et al. |
| 7,893,006 | B2 | 2/2011 | Huang et al. |
| 2005/0016759 | A1 | 1/2005 | Malozemoff et al. |
| 2006/0073979 | A1 | 4/2006 | Thieme et al. |
| 2009/0298696 | A1* | 12/2009 | Otto et al. .................... 505/230 |

FOREIGN PATENT DOCUMENTS

| | | |
|---|---|---|
| WO | 01/11428 | 12/1998 |
| WO | 98/58415 | 12/1998 |
| WO | 99/16941 | 4/1999 |
| WO | 99/17307 | 4/1999 |
| WO | 00/058044 | 10/2000 |
| WO | 00/58044 | 10/2000 |
| WO | 00/58530 | 10/2000 |
| WO | 00/058530 | 10/2000 |
| WO | 01/08169 | 2/2001 |
| WO | 01/08170 | 2/2001 |
| WO | 01/08231 | 2/2001 |
| WO | 01/08232 | 2/2001 |
| WO | 01/008232 | 2/2001 |
| WO | 01/08233 | 2/2001 |
| WO | 01/08235 | 2/2001 |
| WO | 01/008235 | 2/2001 |
| WO | 01/08236 | 2/2001 |
| WO | 01/15245 | 2/2001 |
| WO | 01/26164 | 4/2001 |
| WO | 01/26165 | 4/2001 |
| WO | 02/35615 | 4/2002 |
| WO | 2006/021003 | 8/2005 |
| WO | 2006/023826 | 8/2005 |
| WO | 2005/081710 | 9/2005 |
| WO | 2005/121414 | 12/2005 |

OTHER PUBLICATIONS

Rupich, M.W., et al. "Growth and Characterization of Oxide Buffer Layers for YBCO Coated Conductors" *IEEE Transactions on Applied Superconductivity*, vol. 9, No. 2 (Jun. 1999) pp. 1527-1530.

Shoup, Shara S. "Epitaxial Thin Film Growth of Lanthanum and Neodymium Aluminate Films on Roll-Textured Nickel Using a Sol=Gel Method" *J. Am. Ceram. Soc* 81 [11] pp. 3019-3021 (1998).

Beach, David B., et al. "Sol-Gel Synthesis of Rare Earth Aluminate Films as Buffer Layers for High Tc Superconducting Films" *Mat. Res. Soc. Symp. Proc.* vol. 495 (1998) pp. 263-270.

Paranthaman, M., et al. "Growth of biaxially textured $RE_2O_3$ buffer layers on rolled-Ni substrates using reactive evaporation for HTS-coated conductors" *Supercond. Sci. Technol.* 12 (1999) pp. 319-325.

Lee, Dominic F., et al. "Alternative Buffer Architectures for High Critical Current Density UBCO Superconducting Deposits on Rolling Assisted Biaxially-Textured Substrates" *Jpn. J. Appl/ Phys.* vol. 38 (1999) pp. L 178-L 180.

* cited by examiner

FIG. 1
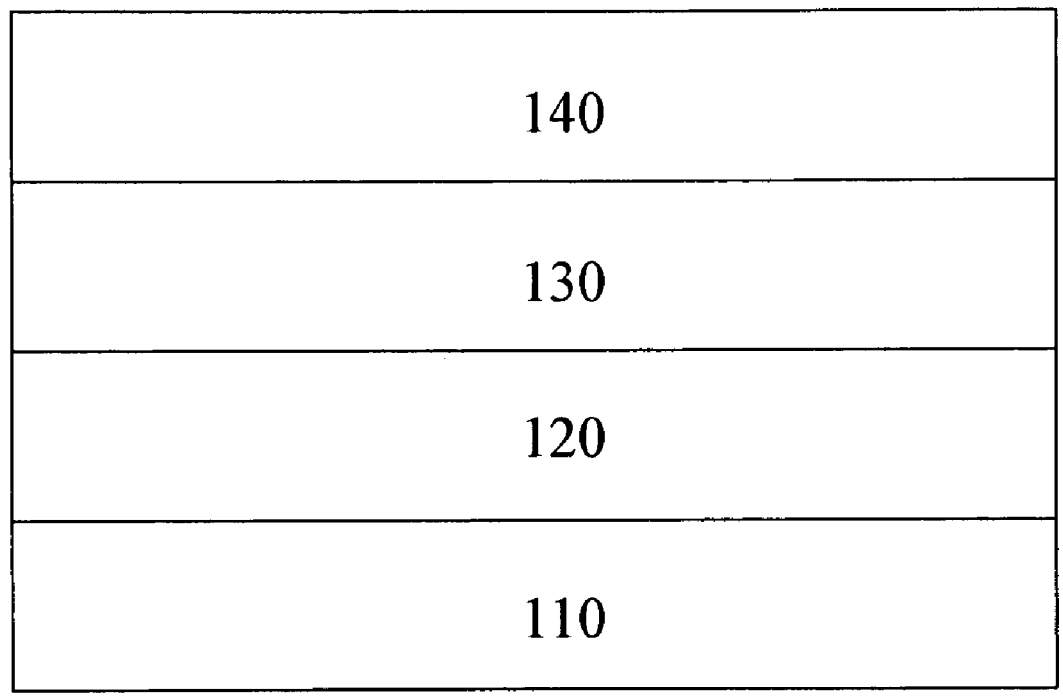

TWO-SIDED SPLICE FOR HIGH TEMPERATURE SUPERCONDUCTOR LAMINATED WIRES

This invention was made with Government support under Agreement No.: HSHQDC-08-9-00001. The Government has certain rights in the invention.

TECHNICAL FIELD

This application relates to the field of high temperature superconductors.

BACKGROUND

High temperature superconductor (HTS) materials provide a means for carrying extremely large amounts of current with extremely low loss. HTS materials lose all resistance to the flow of direct electrical current and nearly all resistance to the flow of alternating current when cooled below a critical temperature. The development of HTS wires (the expression "wires" is used here for a variety of conductors, including tape-like conductors) using these materials promises a new generation of high efficiency, compact, and environmentally friendly electrical equipment, which has the potential to revolutionize electric power grids, transportation, materials processing, and other industries. However, a commercially viable product has stringent engineering requirements, which has complicated the implementation of the technology in commercial applications.

In second generation HTS wire (coated conductor) technology, currently under development, the HTS material is generally a polycrystalline rare-earth/alkaline-earth/copper oxide, e.g. yttrium-barium-copper oxide (YBCO). The current carrying capability of the HTS material is strongly related to its crystalline alignment or texture. Grain boundaries formed by the misalignment of neighboring crystalline superconductor grains are known to form an obstacle to superconducting current flow, but this obstacle decreases with the increasing degree of alignment or texture. Therefore to make the material into a commercially viable product, e.g. an HTS wire, the superconducting material must maintain a high degree of crystalline alignment or texture over relatively long distances. Otherwise, the superconducting current carrying capacity (critical current density) will be limited.

A schematic of a typical second-generation HTS wire 100 is shown in FIG. 1. The wire includes substrate 110, buffer layer 120 (which could include multiple buffer layers), superconductor layer 130, and gap or cap layer 140, and is fabricated as described below. It should be noted that in this and all subsequent figures, the dimensions are not to scale. Superconductor materials can be fabricated with a high degree of crystallographic alignment or texture over large areas by growing a thin layer 130 of the material epitaxially on top of a flexible tape-shaped substrate 110 and buffer layer 120, which are fabricated so that the surface of the topmost layer has a high degree of crystallographic texture at its surface. When the crystalline superconductor material is grown epitaxially on this surface, its crystal alignment grows to match the texture of the substrate. In other words, the substrate texture provides a template for the epitaxial growth of the crystalline superconductor material. Further, the substrate provides structural integrity to the superconductor layer.

Substrate 110 and/or buffer 120 can be textured to provide a template that yields an epitaxial superconductor layer 130 with excellent superconducting properties such as high critical current density. Materials such as nickel, copper, silver, iron, silver alloys, nickel alloys, iron alloys, stainless steel alloys, and copper alloys can be used, among others, in the substrate. Substrate 110 can be textured using a deformation process, such as one involving rolling and recrystallization annealing the substrate. An example of such a process is the rolling-assisted biaxially textured substrate (RABiTS) process. In this case large quantities of metal can be processed economically by deformation processing and annealing and can achieve a high degree of texture.

One or more buffer layers 120 can be deposited or grown on the surface of substrate 110 with suitable crystallographic template on which to grow the superconductor layer 130. Buffer layers 120 also can provide the additional benefit of preventing diffusion over time of atoms from the substrate 110 into the crystalline lattice of the superconductor material 130 or of oxygen into the substrate material. This diffusion, or "poisoning," can disrupt the crystalline alignment and thereby degrade the electrical properties of the superconductor material. Buffer layers 120 also can provide enhanced adhesion between the substrate 110 and the superconductor layer 130. Moreover, the buffer layer(s) 120 can have a coefficient of thermal expansion that is well matched to that of the superconductor material. For implementation of the technology in commercial applications, where the wire may be subjected to stress, this feature is desirable because it can help prevent delamination of the superconductor layer from the substrate.

Alternatively, a non-textured substrate 110 such as HASTELLOY, a corrosion resistant alloy manufactured by Haynes International, Inc. (Kokomo, In) can be used, and textured buffer layer 120 deposited by means such as the ion-beam-assisted deposition (IBAD) or inclined substrate deposition (ISD). Additional buffer layers 120 may be optionally deposited epitaxially on the IBAD or ISD layer to provide the final template for epitaxial deposition of an HTS layer 130.

By using a suitable combination of a substrate 110 and one or more buffer layers 120 as a template, superconductor layer 130 can be grown epitaxially with excellent crystal alignment or texture, also having good adhesion to the template surface, and with a sufficient barrier to poisoning by atoms from the substrate. The superconductor layer 130 can be deposited by any of a variety of methods, including the metal-organic deposition (MOD) process, metal-organic chemical vapor deposition (MOCVD), pulsed laser deposition (PLD), thermal or e-beam evaporation, or other appropriate methods. Lastly, a cap layer 140 can be added to the multilayer assembly, which helps prevent contamination of the superconductor layer from above. The cap layer 140 can be, e.g., silver or a silver-gold alloy, and can be deposited onto the superconductor layer 130 by, e.g., sputtering. In the case where slitting is performed after lamination, the cap layer may also include an additional laminated metal "stabilizer" layer, such as a copper or stainless steel layer, bonded to the cap layer, e.g., by soldering, forming a gap layer.

An exemplary as-fabricated multilayer HTS wire 100 includes a biaxially textured substrate 110 of nickel with 5% tungsten alloy; sequentially deposited epitaxial buffer layers 120 of $Y_2O_3$, yttria stabilized zirconia ("YSZ"), and $CeO_2$; epitaxial layer 130 of YBCO; and a gap layer 140 of Ag. Exemplary thicknesses of these layers are: a substrate of about 25-75 micrometers, buffer layers of about 75 nm each, an YBCO layer of about 1 micrometer, and a gap layer of about 1-3 micrometers. HTS wires 100 as long as 100 m have been manufactured thus far using techniques such as those described above.

During use, it is desirable that the HTS wire is able to tolerate bend strains. A bend induces tensile strain on the convex outer surface of the bend, and compressive strain on the concave inner surface of the bend, thereby subjecting the HTS layer to tensile or compressive strains depending on the direction in which the wire is bent. While a modest amount of compressive stress can actually enhance the current carrying capacity of an HTS layer, in general subjecting the whole assembly to stress (especially repeated stress) places the wire at risk of mechanical damage. For example, cracks could be formed and propagate in the HTS layer, degrading its mechanical and electrical properties, or the different layers could delaminate from each other or from the substrate.

Methods for reducing stress in the HTS layer are described, e.g., in U.S. Pat. No. 6,745,059 and U.S. Pat. No. 6,828,507. For example, a copper strip, chosen to have similar thickness and mechanical features to the substrate, can be bonded onto the upper surface of the insert. This sandwiches the HTS layer roughly in the middle of the overall structure, so if the assembly is bent, the HTS layer is neither at the outer nor inner surface of the bend. Two of these assemblies can also be bonded together at their respective copper strips to form a single HTS wire assembly. In this case, the two substrates face outward, and the copper tapes are in the middle of the assembly. In this case the inclusion of a second assembly provides additional current carrying capacity; however, electrical contact to the HTS layers requires splicing the wire open, or partially removing one of the inserts in the contact section.

A further issue for coated conductor HTS wires is that of environmental contamination when the wire is in use. Environmental exposure can slowly degrade the electrical performance of HTS layers. Also, in the presence of cryogenic liquids such as liquid nitrogen in contact with the wire, the liquid can diffuse into pores within the wire, and on warming can form "balloons" that can damage the wire. Sealing the wire is desirable to prevent either environmental exposure of the HTS layers or penetration of the liquid cryogen into the wire. Seals for HTS assemblies are described in, e.g. U.S. Pat. No. 6,444,917.

The coated conductor approach has been greatly advanced in recent years to the point where long length manufacturing of reinforced tapes is being established. However, the utility of these tapes would be greatly increased if they could be made to any required length via low resistance joints that are mechanically robust and conform to tight geometric tolerances.

HTS wires must be joined in the field to each other and to terminations and leaders. As well, yield and wire quality can improve with factory splicing, thereby reducing wire price and enabling shipment of wires of lengths beyond inherent manufacturing limits. These splices must meet similar requirements as the wire.

Early splices were lap joints. A lap joint is a process of joining two pieces of material by overlapping them. Thus, in the case of HTS wires, two HTS wires can be joined by overlapping the ends of the wires over a set distance and then soldering the wires together. The lap joint method creates a splice that is about 2.0 to 2.2 times the thickness of the original wire.

Although the lap method is feasible for first generation wires or tapes, the second generation tape, where the insulating layer is between the YBCO film and substrate, requires the use of a face-to-face strap or a conductive bridge with a lap joint at each end to retain the original orientation of the parent wire being spliced and to minimize splice resistance. Co-pending U.S. application Ser. No. 11/880,586 discloses the conductive bridge splice in greater detail and the disclosure of which is hereby incorporated by reference in its entirety. However, the conductive bridge structure takes twice as long to make as the simple lap joint, because essentially two laps joints must be made, e.g. one for each end of the strap, doubles splice resistance, and introduces two lumps in the wire per splice. As with first generation wire, if the conductive bridge is the same material as the parent, then the splice will typically be 2.0 to 2.2 times the thickness of the parent wire. The splice should be similar in thickness and mechanical properties to the parent wire the better for cabling, as a stiffer thick region requires greater tension in cabling increases the likelihood of splice splitting in bending, and as short a length as possible to minimize local deviations from cable pitch. These issues are aggravated by the need for thicker lamination strips for adequate wire stabilization in the cable. Therefore, a need exists for a physically and mechanically near symmetric (two-sided), mechanically robust, yet compliant, splice that requires only one joint per splice, while still preserving the mechanical and electrical properties of each of the spliced wires.

SUMMARY

In view of these considerations, one or more embodiments relate to a splice technique that is twice as fast to make than techniques used to make a double lap conductive bridge splice, provides a wire with symmetric mechanical response about its axis and improves splice robustness while reducing splice stiffness.

Two-sided, low cost, low resistance, mechanically robust, thin and geometrically uniform joints for thick superconductor wires are described.

The embodiments disclosed herein relate to a two-sided joint for a HTS laminated wire, where the two-sided joint includes: a first laminated HTS wire having a tapered end across the width of the first laminated wire and comprising a first laminate layer, a substrate layer overlaying the first laminate layer, a buffer layer overlaying the substrate layer, a superconductor layer overlaying the buffer layer, a gap layer overlaying the superconductor layer, and a second laminate layer overlaying the gap layer; a second laminated HTS wire having a tapered end across the width of the second laminated wire and comprising a first laminate layer, a substrate layer overlaying the first laminate layer, a buffer layer overlaying the substrate layer, a superconductor layer overlaying the buffer layer, a gap layer overlaying the buffer layer, and a second laminate layer overlaying the gap layer, wherein the tapered end of the first laminated HTS wire is adjacent to and mated with the tapered end of the second laminated HTS wire; a first HTS strap in electrical communication with the second laminate layer of the first laminated HTS wire and the second laminate layer of the second laminated HTS wire; and a backing strap proximate to the first laminate layer of the first laminated HTS wire and the first laminate layer of the second laminated HTS wire.

The first HTS strap can include a gap layer, a superconductor layer overlaying the gap layer, a buffer layer overlaying the superconductor layer, and a substrate layer overlaying the buffer layer, wherein the gap layer is adjacent to and in electrical communication with the second laminate layer of the first laminated HTS wire and the second laminate layer of the second laminated HTS wire. Additionally, the first HTS strap can include a laminate layer overlaying the substrate layer and/or a second laminate layer interposed between the electrically conductive gap layer and the first and second HTS wires.

The backing strap can be selected to be within about 50% and about 150% or about 90% to about 105% of the thickness of the first HTS strap and/or can include a metal or alloy containing aluminum, zinc, copper, silver, nickel, iron, chrome, lead, silver or molybdenum. Additionally, the backing strap can be a second HTS strap. The second HTS strap can include a substrate layer, a buffer layer overlaying the substrate layer, a superconductor layer overlaying the buffer layer, and a gap layer overlaying the superconductor layer, wherein the gap layer is adjacent to and in electrical communication with the first laminate layer of the first laminated HTS wire and the first laminate layer of the second laminated HTS wire. The second HTS strap can further include a laminate layer proximate to the substrate layer and/or a second laminate layer interposed between the electrically conductive gap layer and the first and second HTS wires. Additionally, the backing strap can be selected such that a first load to impart a 0.5% tensile strain in the backing strap is within a 30% to 150% range of a second load required to impart a 0.5% tensile strain to the first HTS strap. Further, the backing strap and the first HTS strap can be selected such that a first load required to impart 0.5% tensile strain in the backing strap and the first HTS strap combined is less than a second load required to impart 0.5% strain in either of the first laminated wire or the second laminated HTS wire.

In one or more embodiments, the electrical communication can include a metal or alloy with a melting temperature below 240 degrees C. and the metal or alloy can have an ambient temperature resistivity below 50 micro-ohm-cm. Additionally, the metal or alloy can contain any one of Pb, Sn, Ag, Cu or In.

In one or more embodiments, the first laminated HTS wire and the second laminated HTS wire each further include a non-laminated HTS wire interposed between the first laminate layer and the substrate layer, wherein the non-laminated HTS wire comprises a second gap layer overlaying the first laminate layer, a second HTS film layer overlaying the gap layer, a second buffer layer overlaying the second HTS film layer, and a second substrate layer overlaying the second buffer layer, wherein the gap layer of the non-laminated HTS wire is in electrical communication with the first laminate layer. Additionally, a second HTS strap can be in electrical communication with the first laminate layer.

In some embodiments, the first laminated HTS wire and the second laminated HTS wire each have a thickness greater than or equal to about 250 micrometers or greater than or equal to about 300 micrometers. Further, the first HTS strap can have a thickness of less than about 250 micrometers or about 50 micrometers to about 200 micrometers. In some embodiments, the first HTS strap can be between about 2% to about 70% longer than the length of the backing strap and/or about 20% to about 50% longer than the length of the backing strap.

In some embodiments, the angle of each of the tapered first ends relative to the thick laminated wire ranges from about 3 degrees to about 50 degrees. Further, the length of the tapered ends can range about 0.4 cm to about 10 cm. The HTS strap can have a length from about 2 cm to 26 cm or from about 5 cm to 26 cm. The backing strap can have a length from about 6 cm to about 16 cm or from about 1.5 cm to 25 cm.

In one or more embodiments, the laminate of the each laminated wire can be selected from a material consisting of brass, stainless steel, copper or alloys containing zinc, lead, silver, tin, nickel, iron, and aluminum.

In one or more embodiments, the resistance through the joint can be less than 3.0 micro ohms in the 77 K to 293 K temperature range.

In one or more embodiments, bending the two-sided joint on a diameter of 10 cm or less does not produce a physical kink in the joint, does not reduce critical current by more than 15%, does not increase joint resistance by more than 5%. Further, spiral winding the two-sided joint onto a former, wherein the former has a diameter 5 cm or less, with an axial tension in the first and second thick laminated wires of less than 1 kg to 5 kg and a pitch of at least 65 mm such that a gap between the two-sided joint and former is less than 1.5 mm In one or more embodiments, the two-sided joint for an HTS laminated wire includes: a first laminated HTS wire having a tapered first end across the width of the first laminated HTS wire and comprising a first laminate layer, a substrate layer overlaying the first laminate layer, a HTS film layer overlaying the substrate layer; and a second laminate layer overlaying the HTS film layer; a second laminated HTS wire having a tapered first end across the width of the second laminated HTS wire and comprising a first laminate layer, a substrate layer overlaying the first laminate layer, a HTS film layer overlaying the substrate layer, and a second laminate layer overlaying the HTS film layer, and wherein the tapered first end of the first laminated HTS wire is adjacent to and mated with the angled tapered end of the second laminated HTS wire; an upper support in electrical communication with second laminate of the first laminated HTS wire and the second laminate layer of the second laminated HTS wire; and a lower support proximate to the first laminate layer of the first laminated HTS wire and the first laminate layer of the second laminated HTS wire, wherein the materials and dimensions of the joint are selected to provide a neutral axis for the HTS films in the first laminated HTS wire and the second laminated HTS wire.

In one or more embodiments, the two-sided joint for a HTS laminated wire includes: a first laminated HTS wire having a tapered first end and comprising a first laminate layer, a substrate layer overlaying the first laminate layer, a HTS film layer overlaying the substrate layer; and a second laminate layer overlaying the HTS film layer; a second laminated HTS wire having a tapered first end and comprising a first laminate layer, a substrate layer overlaying the first laminate layer, a HTS film layer overlaying the substrate layer, and a second laminate layer overlaying the HTS film layer, and wherein the tapered first end of the first laminated HTS wire is adjacent to and mated with the tapered end of the second laminated HTS wire; a first HTS strap in electrical communication with the second laminate layer of the first laminated HTS wire and the second laminate layer of the second laminated HTS wire; and a backing strap proximate to the first laminate layer of the first laminated HTS wire and the first laminate layer of the second laminated HTS wire, wherein the materials and dimensions of the joint are selected to provide a continuity of mechanical stress across the joint.

Another aspect relates to a superconducting cable including a former having a diameter of 5 cm or less and a plurality of HTS wires, wherein at least one wire has one or more two-sided joints, according to the embodiments disclosed herein, and one or more gaps between the each of the two-sided joint and the former, wherein the gap is less than 1.5 mm. The superconducting cable can have a plurality of wires that are spirally wound around the former at an axial tension between about 0.1 kg to about 7 kg, preferably about 5 kg, and a pitch of 65 mm or greater.

Another aspect relates to a method of winding a superconducting wire including splicing one or more HTS wires to form one or more two-sided joints, according to the embodiments disclosed herein, wrapping the one or more HTS wires around a former in a spiral pattern and creating a gap between the two side joint and the former, wherein the gap is less than about 1.5 mm. In one or more embodiments of the method the plurality of wires are spirally wound around the former at an axial tension between about 0.1 kg to about 7 kg and a pitch of 65 mm or greater.

The expression "HTS wire" or "HTS tape" is intended to indicate a multilayer structure for use in carrying current. The wire or tape may be substantially sealed or isolated from the environment. An HTS wire or tape typically includes a substrate, one or more buffer layers, a superconductor layer, a gap layer, and optionally a stabilizer layer that can be considered part of the gap layer. Generally in this HTS wire or tape, the superconductor layer can be electrically isolated from the metallic substrate by the buffer layer(s). However, if electrically conductive buffer layers are used, the superconductor layer can be electrically connected to the metal substrate. Alternatively, an electrically conductive gap layer can be in contact with both the superconductor layer and the substrate, and provide electrical contact between the two.

The expression "HTS film" is intended to indicate the layers of the HTS wire or tape that are not involved in mechanical support or sealing. Typically, the HTS film includes one or more buffer layers, the superconductor layer, and a gap layer.

The expression "sealed" is intended to mean substantially surrounded and substantially physically isolated from the environment. The expression "sealed" may include, but is not required to include, substantial impermeability to penetration from gas or liquid under normal circumstances.

Typical operating pressures of a cabled wire are up to about 20 bar, but the wire is typically reliability tested up to 30 bar.

The expression "Ic" refers to a critical current of the superconducting wire. The critical current is the maximum current that a superconductor can hold. If the current in the superconductor exceeds the critical current, the superconducting wire loses its superconductivity.

The term "tapered edge" refers to a taper along the width of the superconducting wire where the width of the wire changes and the thickness of the wire remains constant along the taper.

A "kink" is a local bend in a wire with a diameter of less than 3 cm.

BRIEF DESCRIPTION OF THE DRAWINGS

In the drawings:

FIG. 1 is a cross-sectional view of a typical HTS wire.

FIG. 8($b$) is a plot depicting normalized splice resistance through LN2 PT and cabling cycles for an HTS wire, according to one or more embodiments of the present invention.

FIG. 9($b$) is a graph of the ratio of final and initial splice resistance vs. former diameter for 0.4 mm thick brass laminated cable wire at an average initial splice resistance at 77K was 0.39 micro ohms, according to one or more embodiments of the present invention.

DETAILED DESCRIPTION

Laminated high temperature superconductor (HTS) wires are spliced together at joints to form wires that are arbitrarily long. Each HTS wire has a tapered edge for mating to the other HTS wire. A top strap and a bottom strap provide mechanical stability so that the joint can be flexed or bent without breaking the electrical connection between the wires and without damaging the HTS layers of the wires. Either or both of the top strap or bottom strap can be an HTS strap. Furthermore, the embodiments disclosed herein reduce tension in the cable or coil winding for the superconducting wire, reduce the lump impact on coils and cables, preserve the HTS wire orientation through the joint and provide a tempered mechanical response through the joint (reducing the likelihood of a kink and current degradation). The flexibility in the geometry and material selection provides optimized versions for different wires and applications.

Figure 2:
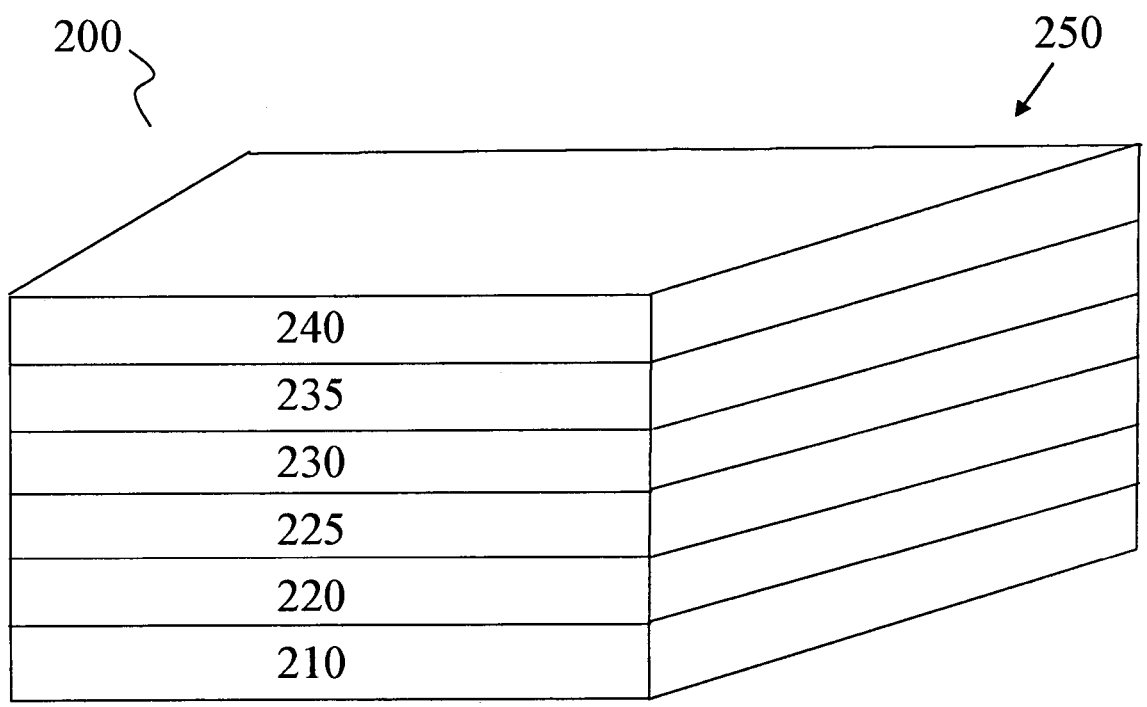
FIG. 2 is a perspective side view of a laminated HTS wire having a tapered end according to one or more embodiments of the invention.

FIG. 2 illustrates a laminated HTS wire 200 having a tapered end 250. The laminated HTS wire 200 includes a first laminate layer 210, a substrate layer 220, a buffer layer 225, a superconductor layer 230, a gap layer 235 and a second laminate layer 240. The laminated wire 200 includes a tapered end 250 for mating with a complementary tapered end of a second laminated HTS wire (not shown). "Complementary" or "mated," as those terms are used herein, is intended to indicate that the tapered edges of two wires are of similar, but opposite, orientations, so that, when placed with tapered edges facing one another, the two tapers form a joint region of dimensions (e.g., width, thickness) substantially similar to the HTS wires. The first laminate layer 210 and the second laminate layer 240 can be brass, stainless steel, copper or alloys containing zinc, lead, tin, nickel, iron, or aluminum and can provide reinforcement to the wire. The buffer layer 225 and the gap layer 235 are substantially similar to the buffer layer 120 and gap layer 140 discussed in reference to FIG. 1. The substrate layer 220 is similar to the substrate layer 110 in the HTS wire shown in FIG. 1 and discussed above and can be, for example, biaxially textured substrate of nickel with 5% tungsten alloy. An HTS film layer includes sequentially deposited buffer layers 225, e.g., epitaxially deposited layers of $Y_2O_3$, YSZ and $CeO_2$; a layer 230 of HTS oxide, e.g., epitaxial layer of YBCO (the superconductor layer 230) and the gap layer 235, e.g., Ag and solder as shown in FIG. 1, as discussed above. The current is carried by the superconductor layer 230.

The tapered end 250 can be at various angles, ranging from 3 degrees to 50 degrees, with a preferred angle range between about 5 and about 10 degrees. The tapered end 250 may range in length (depending on the taper angle and wire thickness) from about 0.4 cm to about 10 cm, preferably from about 1 cm to about 5 cm. A second HTS wire (not shown) can have a complementary tapered end to mate with the tapered end 250 of this HTS wire 200. The use of a tapered end 250 reduces the profile of the joint. Because the two sections of wire mate instead of stack upon each other, the profile of the wire does not double at the site of the splice. Instead, even with the use of two support straps, the thickness profile of the wire at the site of the splice is less than 2 times the thickness profile of the original wire, preferably not more than 1.6 times the thickness.

The laminated HTS wire 200 can be a thick laminated HTS wire, with the additional thickness arising from increased thickness of the laminate. A thick laminated HTS wire is a wire having a thickness of at least 250 micrometers, preferably greater than 300 micrometers, for example, between 360 micrometers and 440 micrometers or between 550 micrometers and 650 micrometers. A thin laminated HTS is a wire with a thickness of less than 250 micrometers, preferably between about 50 micrometers and about 200 micrometers. A thick laminated wire can be used, for example, as a current-limiting wire. A thick laminated wire is preferable for (1) increased electrical and thermal stability, (2) reduced temperature rise in a fault current situation due to larger heat capacity, (3) increased resistance to axial compressive strain induced buckling, (4) increased axial tensile load tolerance, and stress tolerance, and (5) increased resistance to impact or surface contact degradation Thicker laminate materials provide the HTS wire with enhanced robustness, which is important in cabling applications, where the wire is subjected to multiple cycles of complex torsion, bending and axial stress and strain during stranding and also in use. The application of additional overlayers of laminate applies compressive stresses, which can locally deform the wire to conform to any irregularities on the cylindrically rounded cable former surface to which it is wrapped.

The thicker tapes also exhibit much greater resistance to buckling in axially compressive stress/strain conditions which are typical of conditions on the inner side of a bent cable. However, as wire and splice thickness increase, their bending stiffness increases as the cube of the thickness, rapidly making thicker wires and splices difficult to cable unless the temper of the laminate can be reduced to an annealed state.

Further, the thick laminated cables are more robust to permit the cabled HTS wire to experiences stress and strain, as it can be bent and pulled multiple times during use, without substantial performance degradation. When the HTS wire is bent and pulled, the wire sections on the outer and inner sides of the bent cable are subjected to axial tensile and the compressive strain in addition to the winding. Further, once the cable is created, the cable can be cooled with liquid nitrogen at pressures up to about 20 atm, exposing the HTS wires to low temperatures and high pressures. If the cable is heated after cooling, the liquid nitrogen boils away and no longer can cool the cable and associated HTS wires. Thus, the HTS wires can be thermally and pressure-cycled multiple times during typical cable life, i.e., during the cooling and heating phases.

For current-limiting cable applications, the laminate strips also function as heat sinks, so the proportionally higher heat capacity of the thicker material likewise decreases the temperature rise in the wire during a fault, thereby improving the wire's current-limiting characteristics and reducing the likelihood of boiling the liquid nitrogen from the temperature rise caused by a fault.

Figure 3:
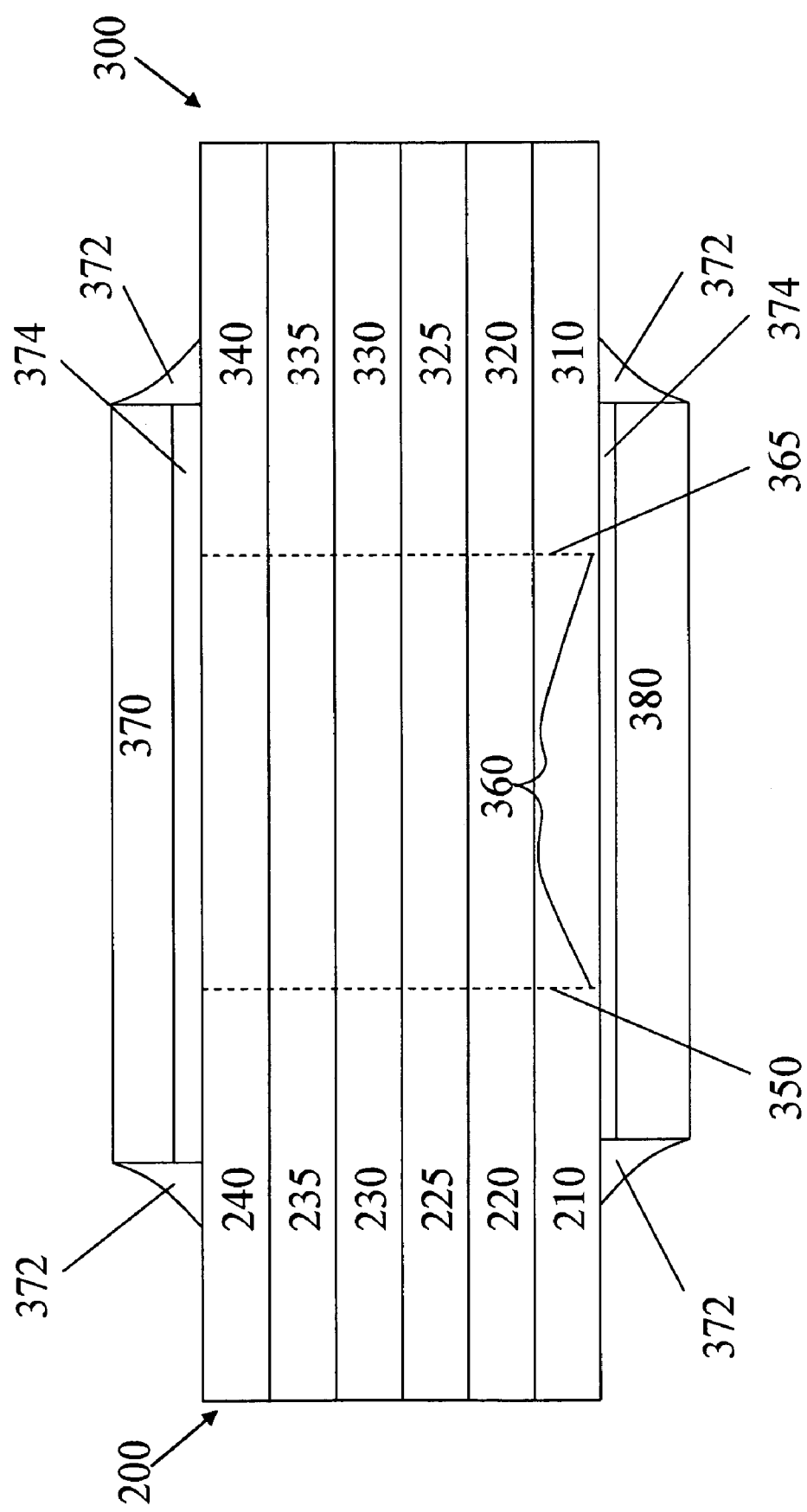
FIG. 3 is a cross-sectional view of a first laminated HTS wire spliced to a second laminated HTS wire by a top strap and a bottom strap according to one or more embodiments of the invention.

FIG. 3 illustrates a first taper ended laminated HTS wire 200 spliced to a second taper ended laminated HTS wire 300 (having a first a first laminate layer 310, a substrate layer 320, a buffer layer 325, a superconductor layer 330, a gap layer 335 and a second laminate layer 340, similar to the first laminated HTS wire 200). The tapered end of the second laminated HTS wire 300 has a tip 350 and the spliced joint has a length 360 which extends from the tip 350 of the second laminated HTS wire 300 to the tip 365 (shown in phantom) of the first laminated HTS wire 200. The length of the joint 360 typically ranges from about 1 cm to about 6 cm.

The two wires can be held together by a top strap 370 and a bottom strap 380, also referred to herein as a "backing strap". The use of laminated HTS wires with tapered ends and the top and bottom straps creates a joint that can be less than twice the thickness of the individual wires and preferably 1.6 or less times the thickness. The top strap 370 can be in electrical communication with the second laminate layers of the first laminated HTS wire 200 and the second laminated HTS wire 300. The bottom strap 380 can be in electrical communication with the first laminate layers 210, 310 of the first laminated HTS wire 200 and the second laminated HTS wire 300. Solder layers 372 may be used as the electrical communication or connection. Solder may also be used to join the tapered faces of the two HTS wires. The joint also includes edge seals 372 of low resistance solder at the end of the top and bottom straps. Each of the top and bottom straps 370, 380 can be composed of a conductive metal, for example, aluminum, brass, copper, silver, nickel, iron, stainless steel, aluminum alloy, copper alloy, silver alloy, nickel alloy, iron alloy, or mixtures thereof. Furthermore, each of the top and bottom straps 370,380 can be HTS wire straps, as discussed in detail below.

In operation, current flows from the first superconductor layer 230, through the gap layer 235 to the laminate 240 of the first laminated HTS wire 200, through the solder 374 and into top strap 370, then flows back through solder 374, into the laminate 340 of the second laminated HTS wire 300 and through the gap layer 335 into the second superconductor layer 330. Additionally, some current may flow directly from the superconductor layer 230 of the first laminated HTS wire to the superconductor layer 330 of the second laminated wire. In contrast, the substrate layers 220 and 320 and the buffer layers 225, 235 have a relatively high electrical resistance, and may even be insulating, so the bottom strap 380 contacting the substrate sides of wires 210, 310 would be unsatisfactorily resistive and current would not flow through from the superconducting layer 230 through the buffer layer 225 and the substrate layer 220 to the bottom joint 380 to the second wire 300.

This kind of low profile two-sided joint is particularly useful for asymmetrical HTS wires, where one side of the wire has a much lower electrical resistance than the other side. Joining two such wires with a top strap 370, e.g., as illustrated in FIG. 3, allows current to flow through the low resistance sides of each of the two wires 200, 300 and top strap 370, and also maintains the overall symmetry of the wire, so that the substrate 220, 320 will generally remain on the same side of the wire on both sides of the joint. In contrast, a simple lap joint between two wires would result in the substrate being on opposite sides of the wire on either side of the joint, and a butt joint between two wires would exhibit high resistivity as well as low mechanical stability.

A further aspect of top and bottom straps is that the joint has structural symmetry. The symmetry of the joint, both above and below the laminated HTS wires, improves winding and cabling operations and increases the mechanical strength and stability of the joint. The top strap 370 and the bottom strap 380 may have the same length or different lengths. Typically, the top strap 370 and the bottom strap 380 range in length from about 1.5 inches to about 30 inches. The top strap 370 can be longer than the bottom strap 380. For example, the length of the top strap can be from about 2% to about 70% longer than the length of the bottom strap, and preferably from about 20% to about 50% longer than the length of the bottom strap. For example, the top strap 370 can range from about 6 cm to about 24 cm while the bottom strap 380 can range from about 6 cm to about 16 cm. Exemplary length combinations are listed in Table 1 below as well as in Table 2 and Table 3 below:

TABLE 1

EXEMPLARY TOP AND BOTTOM STRAP LENGTHS

| Top Strap Length (cm) | Bottom Strap Length (cm) |
|---|---|
| 8 | 6 |
| 24 | 16 |
| 8 | 6 |
| 6 | 6 |

Each of the top and bottom straps can have a thickness of less than about 250 micrometers, preferably from about 30 micrometers to about 200 micrometers. The bottom strap can be selected to be between about 50% to about 150% of the thickness of the top strap. Further, the top strap and the bottom strap may be selected to be between about 90% and about 105% of the width of the first laminated HTS wire and the second laminated HTS wires. The normal state resistance through the joint or splice is decreased by the increased length, but when the length is increased, there is a corresponding increase in stiffness.

The joint itself may be relatively long, providing a long electrical pathway, i.e., a large contact area, over which the current is transferred from the first laminated HTS wire 200 into top strap 370 and then into second laminated HTS wire 300, and thus reducing the resistance of the joint. The limiting factor for the length of the joint is the angle of the tapered edge. For example, the joint 360 may range in length from 1.5 cm to about 40 cm. This way, although a joint may not be as conductive as a single HTS wire, the electrical resistance of the joint may be made low enough to allow the spliced wire to carry a normal operating current.

As mentioned above, a low resistance solder 374 provides the bonding or electrical communication between top strap 370 and the second laminate layers 240, 340 and the bottom strap 380 and the first laminate layers 210, 310. In some embodiments, the electrical communication may be a metal or alloy with a melting temperature below 240 degrees C. and/or an ambient temperature resistivity below 50 micro-ohm-cm. For example, the electrical communication may be a metal or an alloy containing any one of Pb, Sn, Ag, Cu, In, Sb, Bi, As or Cd. In some embodiments, the solder may be indium, Pb—Sn, or Pb—Sn—Ag. Wetting of the solder 374 may be enhanced with chemical flux that is applied in situ or prior to melting, by mechanical abrasion induced surface activation, or by surface treatments such as plasma etching. The four transition regions from strap to wire can optionally be treated by forming solder edge seals or solder "ramps" 372 from the top of the ledge at the end of the strap down to and along the wire. This substantially seals the end to the environment, and also reduces the stress and strain that the wire experiences because of the sharp ledge, which in some circumstances could otherwise lead to kinking, delamination, and/or degradation of the superconductor layer and its critical current. However, as discussed in greater detail below, the use of certain materials and architectures reduces mechanical stress in the joint, thus obviating the need for providing solder edge seals, in some applications.

Note however that the solder "ramps" 372 such as illustrated in FIG. 3 need not be included in all embodiments. For example, the ends of straps 370, 380 can instead be sealed with solder beads of arbitrary shape. Or, for example, the ends of straps 370, 380 need not be sealed using edge seals 372 at all, but rather the presence of a filler can be used to seal the ends. An additional material also can be used to enhance adhesion of the filler to the ends of straps 370, 380, since the edge seals are not required to carry current.

Figure 4:
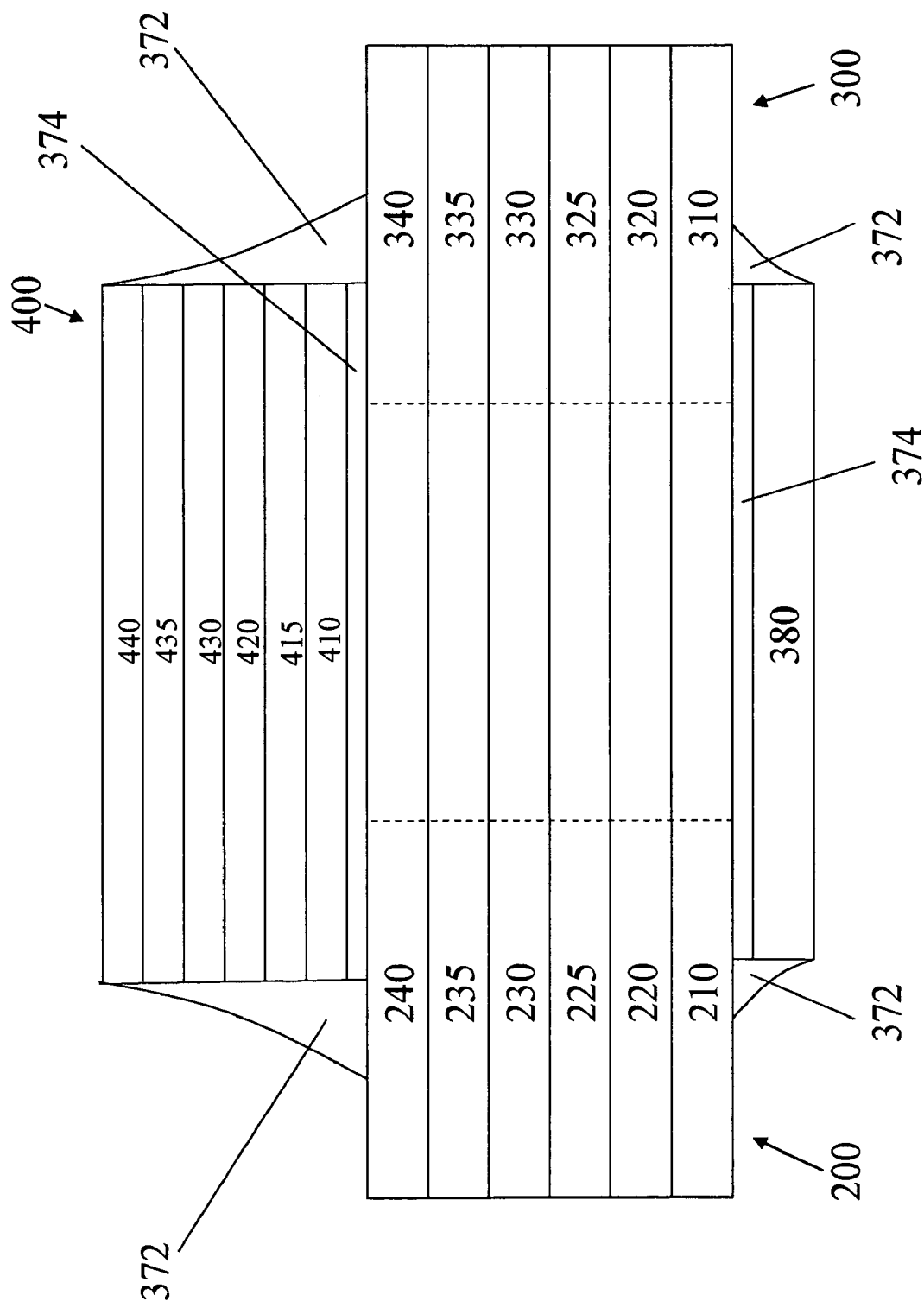
FIG. 4 is a cross-sectional side view of a first laminated HTS wire spliced to a second laminated HTS wire by a first HTS strap and a bottom strap according to one or more embodiments of the invention.

FIG. 4 illustrates an embodiment in which the top strap is a first HTS strap 400. The HTS strap 400 can include an optional laminate layer 410, a gap layer 415, a superconductor layer 420, a buffer layer 430, a substrate layer 435, and an optional second laminate layer 440. In one or more embodiments, the HTS strap 400 is thinner than HTS wires 200, 300. For example, the HTS strap 400 can be less than about 250 microns, and preferably between about 50 microns and about 200 microns. The superconductor layer 420 is positioned such that the superconductor layer 420 is in electrical communication through the gap layer 415 with the superconductor layer 230, 330 of the first laminated HTS wire and the second laminated HTS wire through the gap layer 415 and the solder 374. The substrate 430 of the HTS strap 400 is therefore spaced apart from HTS wires 200, 300, with the gap layer 415, the superconducting layer 420, and the buffer layer 430 disposed in between. The HTS strap 400 can be composed of the same or similar materials as the first laminated HTS wire 200 and the second laminated HTS wire 300. Preferably, the HTS strap 400 includes an HTS film on a high strength substrate, for example HASTELLOY, a corrosion resistant alloy manufactured by Haynes International, Inc. (Kokomo, In) or a 25 micrometer 316L stainless steel per side laminated HTS tape (PN 8600) manufactured by American Superconductor (Devens, Mass.). The HTS strap 400 also can be an Ion Beam Assisted Deposition "IBAD" coated conductor HTS strap. Further the HTS strap 400 can be a section of HTS wire manufactured by Superpower, Inc. (Schenectady, N.Y.). The HTS strap 400 can have a length and width similar to that of the top strap 370.

The HTS strap 400 can be soldered to the second laminates 240 and 340 of the first and second laminated wires by a solder strip 374 in a manner similar to how the top strap is attached to the second laminate. The HTS strap 400 also can have solder ramps 372.

The resistivity of the joint with the HTS strap 400 is lower than the resistivity of the joint with a plain metal strap (FIG. 3). The use of the HTS strap 400 can reduce the resistance through the joint to less than 3.0 micro ohms in the 77 K to 293 K temperature range.

The HTS strap 400 can include one or more laminate strips 410, 440. The first laminate strip 440 may overlay the substrate 435. The second laminate strip 410 may be positioned between the gap layer 415 and the second laminate layers 240, 340 of the first and second laminated HTS wires 200, 300. The laminate strips or layers 410, 440 may be composed of brass, stainless steel, copper or alloys containing zinc, lead, silver, tin, nickel, iron or aluminum and can be added to provide additional mechanical strength to the HTS strap 400.

If the HTS strap is constructed from previously laminated wire, the laminate strip on one side of each of the wires may be removed or reduced in thickness from the intended overlap region of each end, by for example etching, mechanical abrasion or melt—peeling. Removing or reducing the thickness of the laminate strip reduces the joint resistance, because the laminate strip may have a somewhat higher resistivity than is desirable over the length of the joint. Alternatively, the laminate strip may be left in the wire or added to a wire that does not have laminate strip(s), and the overlap joint may be lengthened within practical limits to compensate for the additional through joint resistance the laminate strip causes. If a higher resistance joint is desired (fault current limiter wire), a layer of stainless steel or other high resistance metal in between the splice can be used to raise the overall resistance of the splice. Also, for example, electrical-insulation coated and/or sealed HTS wires can be joined using the methods described herein. Here, the insulation is removed from the overlap region before or during the splicing operation. Insulation may also be applied or re-applied after the splice joint is made to electrically insulate and/or to seal the splice region.

Figure 5:
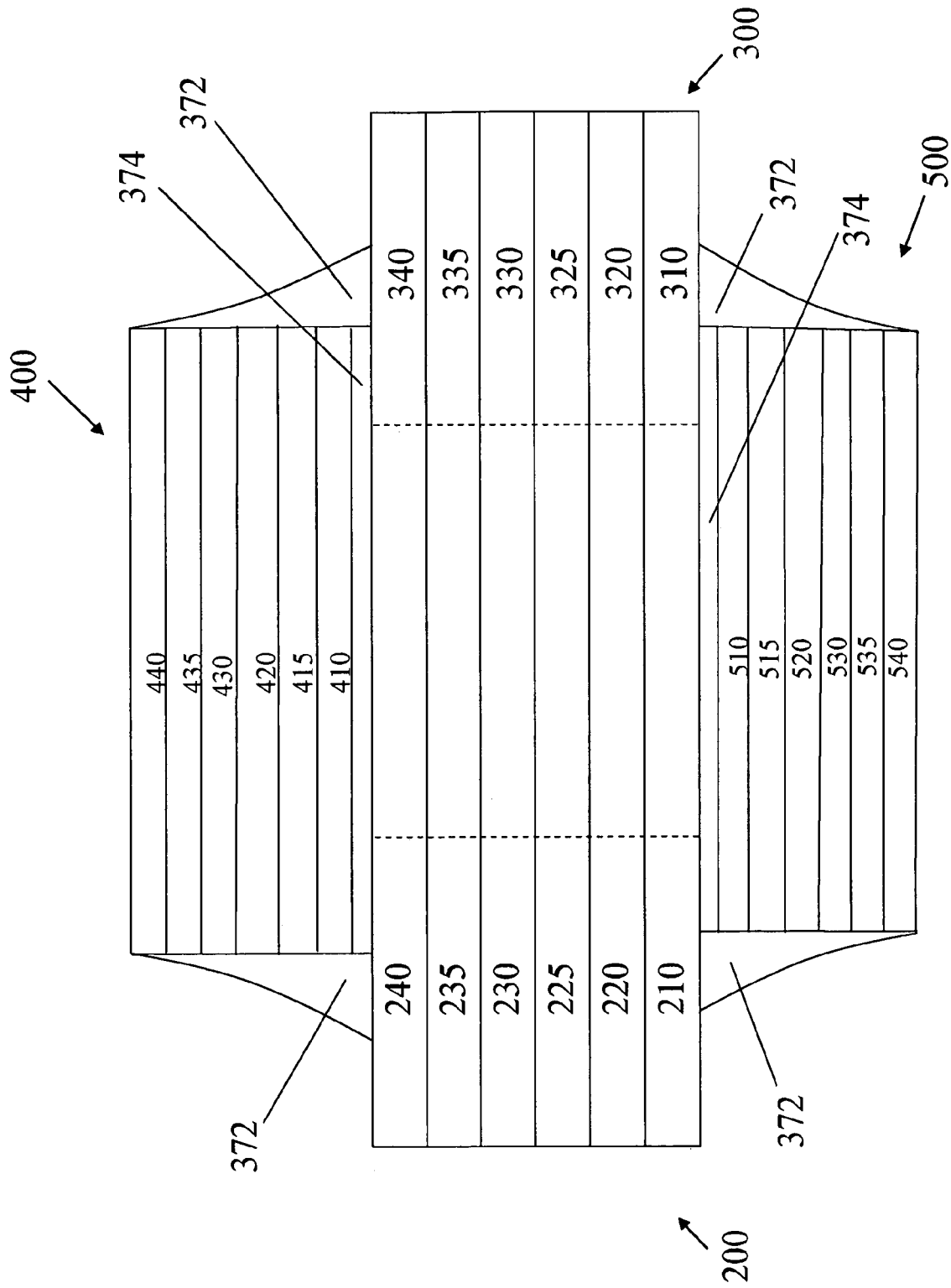
FIG. 5 is a cross-sectional side view of a first laminated HTS wire spliced to a second laminated HTS wire by a first HTS strap and a second HTS strap according to one or more embodiments of the invention.

In some embodiments, the bottom strap 380 also can be an HTS strap 500 as shown in FIG. 5. The bottom HTS strap 500 can have the same properties and configurations as the top HTS strap 400, including an optional first laminate layer 510, a gap layer 515, a superconductor layer 520, a buffer layer 530, a substrate layer 535, and an optional second laminated layer 540, except that the gap layer of the bottom HTS strap 500 can be facing the first laminated layer 210 and the second laminated layer 310 of the first HTS wire 200 and the second HTS wire 300, such that the cap layer of the bottom HTS strap 500 is in electrical communication with the laminate layers 210, 310 of the first and second laminated HTS wires 200, 300. The bottom HTS strap 500 also can be configured to have laminated strips inserted into the bottom HTS strap 500 in a similar manner as the laminated strips are inserted into the top HTS strap 400.

Figure 6:
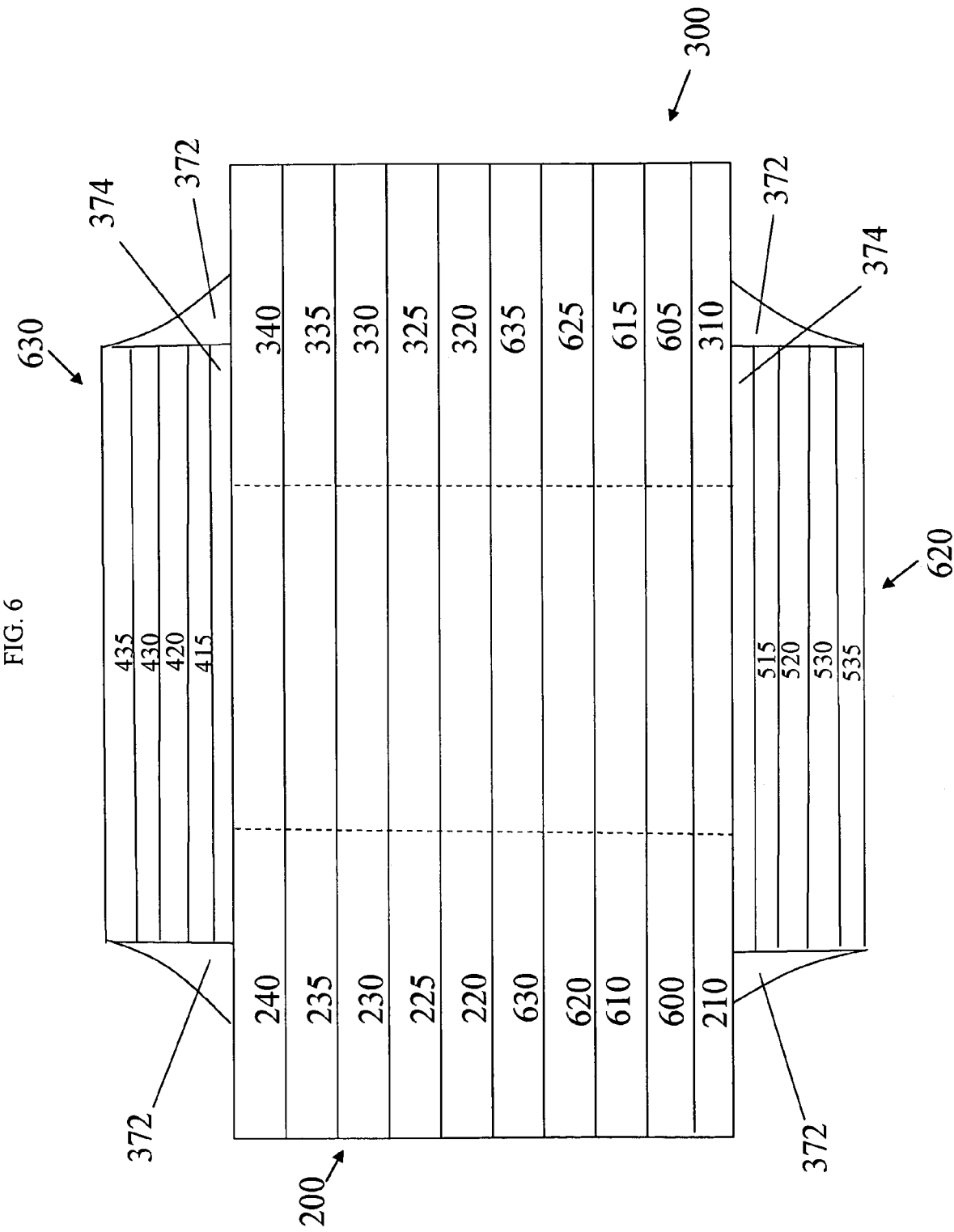
FIG. 6 is a cross-sectional side view of a 4-ply laminated HTS wire according to one or more embodiments of the invention.

In the embodiment illustrated in FIG. 6, the first laminated HTS wire 200 and the second laminated HTS wire are four-ply wires which include, in addition to the substrate layer 220, 320, a buffer layer 225, 325 and a superconductor layer 230, 330, a gap layer 235, 335, a second gap layer 600, 605 overlaying the first laminate layer 210, 310, a second superconductor layer 610, 615 overlaying the gap layer, 600, 605, a second buffer layer 620, 625 overlaying the second superconductor layer 610, 615 and a second substrate layer 630, 635 overlaying the second buffer layer 620, 625. In this embodiment, both the top strap and the bottom strap are HTS straps 620, 630. The second HTS strap 620 can permit the flow of current from the second gap layer 600 to the second HTS strap 620 to the second gap layer 605. The orientations of the HTS straps 620, 630 are selected to provide a conductive pathway through the straps, as described above. Further the HTS straps 620, 630 as shown in FIG. 6 do not contain laminate layers. However, as shown above, each of the HTS strap layers can include one or more laminate layers.

In the embodiments illustrated in FIGS. 2-6, the materials and dimensions can be selected to provide a neutral axis for the HTS films in the laminated wires. For example, the lengths of the top and bottom straps can be adjusted, as well as the amount of laminate in each, in order to reduce mechanical stresses on the HTS films. Additionally, the material and dimensions can be selected to provide a mechanical continuity between the first and second wires.

In one or more embodiments, the lengths of the top and bottom straps are selected to provide a gradual mechanical property transition between the splice and the laminated HTS wire, which in turn mitigates kinking when, for example, the splice region is bent to the 30-100 mm bend diameter range (kinking here is defined as local bending of some part of the splice or wire region to <about 3 cm diameter, often to well below 1 cm diameter, even though the overall bend diameter of the region may be 5 cm or greater). For example, the two-sided joint disclosed herein when bent to a diameter of 10 cm or less (for example, 5 cm or 3 cm) does not produce a physical kink in the joint, does not reduce critical current by more than 15%, and does not increase joint resistance by more than 5%.

Furthermore, HTS wires using previous joints, when used in a superconducting cable application (where the superconducting wires are wound around a former to create a cable) result in large gaps, of greater than about 2 mm, between the cable and the former. These large gaps can be caused by stiffness in the joints or splices and can weaken the superconducting wire and negatively affect current flow. However, the use of the HTS wires having two-sided joints, as disclosed herein, in a superconducting cable application can reduce the size of the gaps between the wire and the former, thus improving the strength of the wire and the current performance. For example, when creating a superconducting cable by spiral winding one or more superconducting wires having one or more two-sided joints as disclosed herein onto a former of diameter 5 cm or less, the gap between joint region and the former can be less than 1.5 mm. The parameters of the winding can include an axial tension in the first and second laminated HTS wires between about 0.1 kg to 7 kg and a pitch of 65 mm or greater.

Furthermore, the backing strap and the first HTS strap 400 can be selected to achieve optimal loading across the joint to create a neutral axis for the superconducting layers. Creating a neutral axis for the superconducting layer reduces the stress and strain on the superconducting layer when it is cabled and contorted, i.e., during normal operation in a cabling application. This reduction in stress and strain on the superconducting layer during normal operation permits optimum current flow through the superconducting wire. For example, the backing strap can be selected such that a load to impart between about a 0.3% to a 0.5% tensile strain in the backing strap is within a 30% to 150% range of a second load required to impart a 0.5% tensile strain the first HTS strap. Thus, the load that imports the same strain on the back strap can be different from the load that imports the same strain on the HTS strap. Additionally, the backing strap and the first HTS strap can be selected such that the load that imports a strain in both the backing strap and the HTS strap is less than the load required to impart the same strain on the laminated HTS wires. For example, the load required to impart 0.5% tensile strain in the backing strap and the first HTS strap combined is less than a second load required to impart 0.5% strain in either of the first laminated wire or the second laminated HTS wire. Thus, the first HTS strap and the backing strap are chosen such that they will not substantially increase the stiffness of the joint and will not substantially affect the mechanical continuity of the joint.

In some embodiments, the solder ramp at the transition from the strap ends to the thick tape extension can provide mechanical continuity through the joint. This ramp is produced by reflowing solder and pulling the bead from the end of the strap about 5-10 mm along the thick tape surface. The ramp enhances the gradual transition from the mechanical properties of the thick spliced region to laminated HTS wire.

In the embodiments illustrated in FIGS. 2-6, the back side of the substrates (the side opposite the HTS) can be treated to enhance wetting of the substrate by a filler. For example, as described in U.S. patent application Ser. No. 11/193,262, filed Jul. 19, 2005 and entitled "Architecture for High Temperature Superconductor Wire," the entire contents of which are incorporated by reference, some useful wetting layers include Ag, Cu, Ni, Ti, and TiN, which can be coated onto the substrate using, e.g., sputtering.

In embodiments in which current flows through laminate strips as it passes through the joint, the surface of the laminate strip can be modified prior to lamination in order to improve the resistivity of the joint and/or adhesion of filler or solder to the laminate strip. For example, for Cu laminate strips, a layer of low melting point metal, such as solder or Sn, can be applied to the strips in order to enable faster bonding. Or, for example, for stainless steel laminate strips, a Ni strike layer and a layer of pure Sn can be applied, although other low melting point alloys could be used. The Ni strike layer is used to improve the adhesion of Sn to the stainless steel. The Sn layer improves the wettability of the stainless steel by the solder during later lamination to the superconductor wire. The thickness of the Sn layer can range, e.g., from 40 micro inches to 200 or more micro inches, e.g., 50 micro inches. Before application of the Ni and Sn layers, the stainless steel laminate strips are prepared by electrically, chemically or mechanically cleaning the surface, e.g., by using a fully activated stainless steel flux, or by scrubbing the surface with an abrasive wheel. This preparation activates the stainless steel, eliminating $Cr_2O_3$ oxide from the surface and thus reducing the resistivity of the surface. Or, for example, for brass laminate strips, such stringent activation is not necessary. The brass can be cleaned with a mild detergent and plated with Sn, Sn—Pb, or Cu, for example.

In different embodiments, different materials are suitable for use as filler and/or solder in the joint and/or wires. For example, although many of the example wires described below use indium solder, Sn—Pb and Sn—Pb—Ag may also be suitable. Depending on the filler used to reinforce laminate strips to the assembly, Sn—Pb and Sn—Pb—Ag may have a similar melting point and a similar mechanical strength to the filler, and thus reduce thermal and mechanical mismatch between the solder and the filler which can result in delamination upon stress. For example, in the case where both the filler and the solder used is Sn—Pb, the mismatch would be negligible and thus result in a particularly strong joint. Thus in some embodiments, solder "ramps" 372 need not have the same configuration as that shown in FIG. 3 in order to mitigate kinking, delamination, and/or degradation of the superconductor layer.

It is advantageous to produce a splice with lower electrical resistance as this reduces energy loss, cooling cost and local overheating during electric current passage through the splice. Lower electrical resistance of the electrical connection material reduces splice resistance. At the same time the melting temperature of the electrical connection material has to be sufficiently low, if the splice is made by a soldering method, so as to not damage the HTS material (around 300 degrees C. max) and impair the thick laminated tape structural integrity by excessively melting the lamination solder attaching the different components.

For example, laminated HTS tape can be made with an Sn—Pb—Ag based solder that melts in the 170-180 C range (Sn-36%+/−3% Pb-2%+/−1% Ag). Additional solders with higher melting temperatures and lower electrical resistivities have been tested for use. These lamination solders include Sn-3.5%+/−1.5% Ag with melting in the 215 C-225 C range, Sn-3.8%+/−1.5% Ag-0.7%+/−0.3% Cu with melting in 212 C-222 C range, and Sn-5%+/−1.5% Sb with melting in 230-250 C range.

However, splice connection solder requires a material with melting temperature approximately at or below the melting temperature of the lamination solder. For the Sn—Pb—Ag lamination solder, both In-based solders that melt in the 155-165 C range, and the lamination solder itself with 170-180 C melting temperature as described above have been used as splice solders. The above described solders therefore all can be used as splice solders as long as the lamination solder melting temperature is substantially equivalent to or exceeds the splice solder melting temperature.

The above solders also are selected because of their relatively low electrical resistivity, none exceed 25 micro-ohm cm at ambient, and some are as low as 12 micro-ohm cm, as well as their relatively high strength (35-55 MPa). Further, it is also advantageous to employ a lead free solder—such as In, or the high melting temperature solders listed above.

It is also possible to use the same solder for both lamination and splicing to limit splice solder/lamination solder compatibility and contamination issues that can degrade the properties and reliability of the splice and wire. In summary, the range of solders contemplated is 10 to 25 micro ohms at ambient, with tensile strengths exceeding 35 MPa and melting temperatures in the 155 C to 240 C range.

Figure 7:
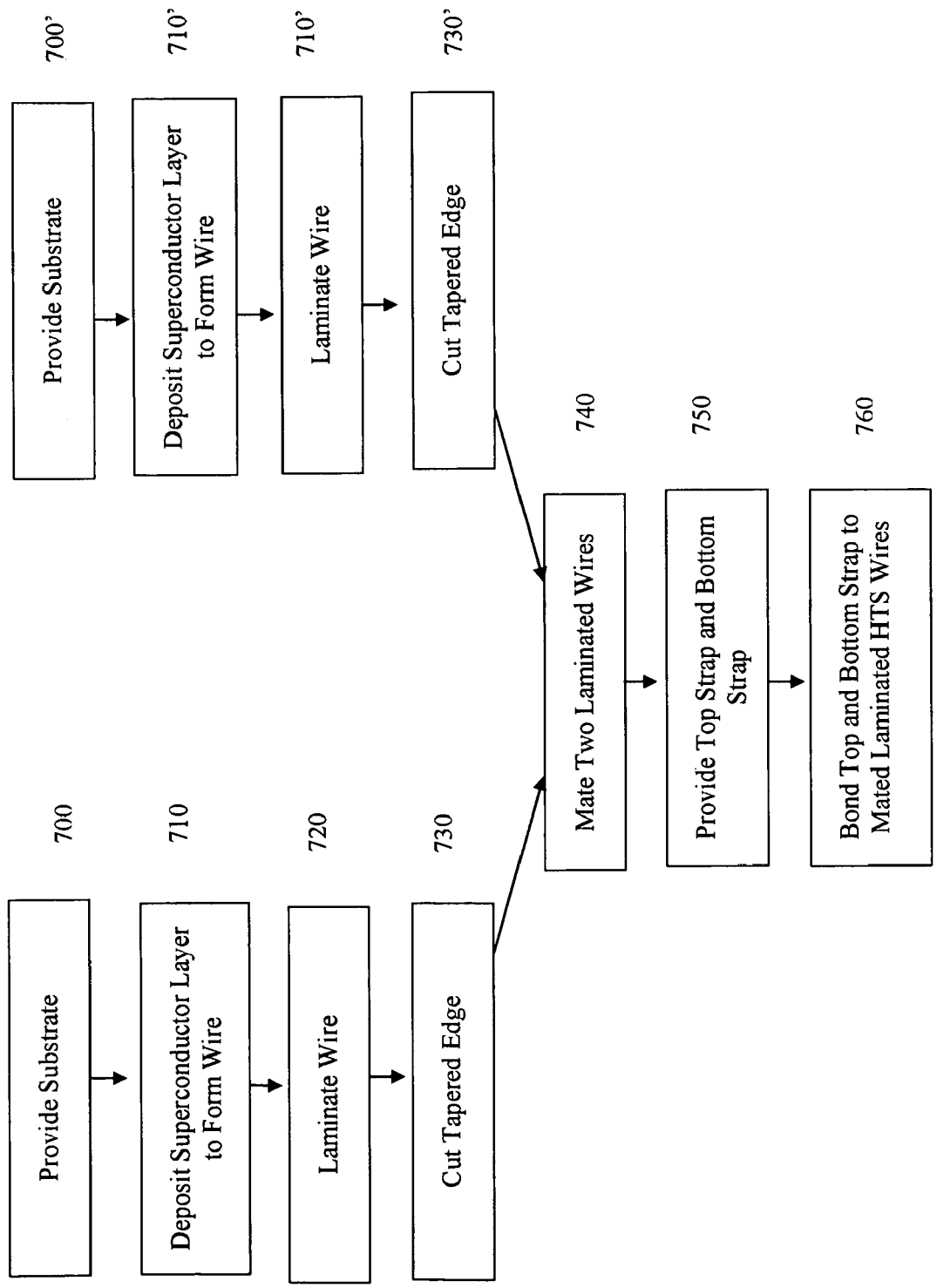
FIG. 7 is a flow chart of a method for fabricating two HTS wires and splicing them together with a two-sided joint according to one or more embodiments of the invention.

FIG. 7 illustrates an exemplary method for producing the joined HTS wires illustrated in FIGS. 2-6. First, the first HTS wire is fabricated. A substrate is provided (700); an HTS film (including buffer, superconductor, and cap layers) is deposited on the substrate to form a wire (710); the substrate and the HTS film layer are laminated (720); a tapered edge is cut into the laminated wire (730). Separately, the second HTS wire is fabricated by providing a substrate (700'); depositing a HTS film (including buffer, superconductor, and cap layers) over the substrate to form a wire (710'); laminating the substrate and the HTS film layer (720'), and cutting a tapered edge into the laminated wire (730'). The tapered end can be achieved with a precision shearing tool or clippers, although sawing may also be used. The surfaces of the components are then wiped clean, fluxed, reflowed with splice solder, and placed in the required architecture in the splice fixture.

Next, the first HTS wire and the second HTS wire are mated at their respective tapered edges (740). Then, the top strap and the bottom strap are provided from a third HTS wire or from a metal strap (750). The straps for the splice are manufactured and cut into the required lengths, preferably so as to not introduce significant burrs at the cut ends, and not degrade the superconducting or mechanical properties. The lengths of the straps are selected to provide a satisfactory electrical resistance over the entire length of the joint. Next, the top and bottom straps are bonded to the two mated laminated HTS wires, for example, through soldering (760). A fixture press is then applied, with heat, increasing the temperature of the local components adequately to melt the splice solder and compress the parts, followed by cooling while compressed, and allowing the solder to solidify. Lateral and through-tape alignments of each tape end is maintained during splice soldering and re-flow by edge guides or channels, as well as a sled or pressure bar or fixture for the top and bottom surfaces. Afterwards, splice dimensions, Ic, and resistance are typically measured to assess splice quality and conformance to standard specifications, and they are also visually inspected for structural integrity.

If the HTS straps (top and/or bottom) are reinforced with a lamination strip as described below, the splice and re-flow temperatures are kept below the incipient melting temperature of the material that reinforces the laminate strip to HTS film, e.g., solder or its related phases formed from solder interaction with the cap layer and the laminate strip.

Lamination

The method for laminating together the laminate strips consists of feeding the wire (HTS/Substrate) to be laminated into a solder lamination line, comprised of an initial cleaning and flux application station, then an immersion into a molten solder bath, while the laminate strips and wire are forced together by tooling as well as to keep them properly aligned laterally. The assembly then passes out of the solder chamber and is cooled rapidly to solidify the solder and produce a fully bonded composite. Several architecture variations can be readily produced by this method, including 4-ply (discussed below), 3-ply, 2-ply and 1-ply HTS wires. The 3-ply architecture can include two laminate strips, one attached by solder to either side of the HTS/substrate wire, where the HTS portion can include a buffer layer and a superconducting layer. The substrate wire may also contain a silver "cap" layer for enhanced wetting and protection. The 2-ply architecture can include a single laminate strip solder laminated onto the substrate side of the HTS/substrate wire—for example, for use as an HTS strap tape. The 1-ply architecture can be simply the HTS/substrate tape, with possibly an inner layer of silver, in the 0 to 5 micrometer thickness range, and an outer, preferably Cu layer, of a thickness of about 25 micrometers, but possibly as thick as 50 micrometers.

In the 4-ply variation, two HTS/substrate tapes are fed into the lamination line, along with two laminate strips, one for each side of the HTS/substrate assembly, resulting in the two HTS/substrate tapes sandwiched between the two laminates, such that the substrate sides are adjacent to each other, and the HTS films face the laminate strips.

If desired, or sealing material such as an electrically insulating coating, can be applied to one or both sides of the spliced wire, or completely surrounding the spliced wire.

In general, the steps of the method can be executed in a different order than that given. The steps of the method can be performed manually and/or automatically. For example, cutting the ends of the wires can be performed manually, and pressing the solder-wetted conductive bridge and wire(s) together can be performed automatically, e.g., in a die. Note also that the joint need not solely be used to join two separately fabricated wires; the joint is also useful for repairing a break in a single wire, or generally for providing a low-resistance electrical connection between any two HTS wires.

A method for making an YBCO HTS wire that can be joined using the methods described herein is described. Other kinds of HTS wires can be joined using the methods described herein, and the splice, first wire, and second wire need not be identical. For example the HTS wire can be a bismuth-strontium-calcium copper oxide (BSCCO) superconductor or a MgB superconductor.

Fabricating and Splicing HTS Wires
Textured Metal Substrate

The template is provided in widths of about 1 to 10 cm, or larger. Optionally, it is textured. A method of preparing a textured metal substrate suitable for use as a substrate for an HTS wire first is described. At a first station, a substrate is treated to obtain biaxial texture. Preferably, the substrate surface has a relatively well-defined crystallographic orientation. For example, the surface can be a biaxially textured surface (e.g., a (113)[211] surface) or a cube textured surface (e.g., a (100)[011] surface or a (100)[001] surface). Preferably, the peaks in an X-ray diffraction pole figure of surface 110 have a FWHM of less than about 20° (e.g., less than about 15°, less than about 10°, or from about 5° to about 10°).

The surface of the substrate can be prepared, for example, by rolling and annealing. Surfaces can also be prepared using vacuum processes, such as ion beam assisted deposition, inclined substrate deposition and other vacuum techniques known in the art to form a biaxially textured surface on, for example, a randomly oriented polycrystalline surface. In certain embodiments (e.g., when ion beam assisted deposition is used), the surface of the substrate need not be textured (e.g., the surface can be randomly oriented polycrystalline, or the surface can be amorphous).

The substrate can be formed of any material capable of supporting a buffer layer stack and/or a layer of superconductor material. Examples of substrate materials that can be used as the substrate include for example, metals and/or alloys, such as nickel, silver, copper, zinc, aluminum, iron, chromium, vanadium, palladium, molybdenum and/or their alloys. In some embodiments, the substrate can be formed of a superalloy. In certain embodiments, the substrate can be in the form of an object having a relatively large surface area (e.g., a tape or a wafer). In these embodiments, the substrate is preferably formed of a relatively flexible material.

In some of these embodiments, the substrate is a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities).

In certain of these embodiments, the substrate contains more than two metals (e.g., a ternary alloy or a quaternary alloy). In some of these embodiments, the alloy can contain one or more oxide formers (e.g., Mg, Al, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. In certain of these embodiments, the alloy can contain two of the following metals: copper, nickel, chromium, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g., annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g., Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

In some embodiments, stable oxide formation at the surface can be mitigated until a first epitaxial (for example, buffer) layer is formed on the biaxially textured alloy surface, using an intermediate layer disposed on the surface of the substrate. Intermediate layers include those epitaxial metal or alloy layers that do not form surface oxides when exposed to conditions as established by $PO_2$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the substrate in a surface treatment. The sulfur can be formed on the surface of the substrate, for example, by exposing the intermediate layer to a gas environment containing a source of sulfur (e.g., $H_2S$) and hydrogen (e.g., hydrogen, or a mix of hydrogen and an inert gas, such as a 5% hydrogen/argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850° C.). The pressure of the hydrogen (or hydrogen/inert gas mixture) can be relatively low (e.g., less than about one torr, less than about $1 \times 10^{-3}$ torr, less than about $1 \times 10^{-6}$ torr) or relatively high (e.g., greater than about 1 torr, greater than about 100 torr, greater than about 760 torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., c(2×2)) can be formed by applying an appropriate organic solution to the surface of the intermediate layer by heating to an appropriate temperature in an appropriate gas environment. It can also be obtained by allowing sulfur, which can be added to the substrate material, to diffuse to the surface of the substrate.

Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface.

The substrate may also be untextured, for example, using HASTELLOY, a corrosion resistant alloy manufactured by Haynes International, Inc. (Kokomo, Ind.) or other commercial metals.

Buffer Layer

In a second processing station, a buffer layer is formed on the textured substrate.

Examples of buffer materials include metals and metal oxides, such as silver, nickel, TbO, $CeO_2$, yttria-stabilized zirconia (YSZ), $Y_2O_3$, $Gd_2O_3$, $LaAlO_3$, $SrTiO_3$, $LaNiO_3$, $LaCuO_3$, $SrRuO_3$, $NdGaO_3$, $NdAlO_3$ and/or nitrides as known to those skilled in the art.

In certain embodiments, an epitaxial buffer layer can be formed using a low vacuum vapor deposition process (e.g., a process performed at a pressure of at least about $1 \times 10^3$ torr). The process can include forming the epitaxial layer using a relatively high velocity and/or focused gas beam of buffer layer material.

The buffer layer material in the gas beam can have a velocity of greater than about one meter per second (e.g., greater than about 10 meters per second or greater than about 100 meters per second). At least about 50% of the buffer layer material in the beam can be incident on the target surface (e.g., at least about 75% of the buffer layer material in the beam can be incident on the target surface, or at least about 90% of the buffer layer material in the beam can be incident on the target surface).

The method can include placing a target surface (e.g., a substrate surface or a buffer layer surface) in a low vacuum environment, and heating the target surface to a temperature which is greater than the threshold temperature for forming an epitaxial layer of the desired material on the target surface in a high vacuum environment (e.g., less than about $1 \times 10^{-3}$ torr, such as less than about $1 \times 10^{-4}$ torr) under otherwise identical conditions. A gas beam containing the buffer layer material and optionally an inert carrier gas is directed at the target surface at a velocity of at least about one meter per second. A conditioning gas is provided in the low vacuum environment. The conditioning gas can be contained in the gas beam, or the conditioning gas can be introduced into the low vacuum environment in a different manner (e.g., leaked into the environment). The conditioning gas can react with species (e.g., contaminants) present at the target surface to remove the species, which can promote the nucleation of the epitaxial buffer layer.

The epitaxial buffer layer can be grown on a target surface using a low vacuum (e.g., at least about $1 \times 10^{-3}$ torr, at least about 0.1 torr, or at least about 1 torr) at a surface temperature below the temperature used to grow the epitaxial layer using physical vapor deposition at a high vacuum (e.g., at most about $1 \times 10^{-4}$ torr). The temperature of the target surface can be, for example, from about 25° C. to about 800° C. (e.g., from about 500° C. to about 800° C., or from about 500° C. to about 650° C.).

The epitaxial layer can be grown at a relatively fast rate, such as, for example, at least about 50 Angstroms per second.

These methods are described in U.S. Pat. No. 6,027,564, issued Feb. 22, 2000, and entitled "Low Vacuum Process for Producing Epitaxial Layers;" U.S. Pat. No. 6,022,832, issued Feb. 8, 2000, and entitled "Low Vacuum Process for Producing Superconductor Articles with Epitaxial Layers;" and/or commonly owned U.S. patent application Ser. No. 09/007, 372 filed Jan. 15, 1998, and entitled "Low Vacuum Process for Producing Epitaxial Layers of Semiconductor Material," all of which are hereby incorporated by reference.

In some embodiments, an epitaxial buffer layer can be deposited by sputtering from a metal or metal oxide target at a high throughput. Heating of the substrate can be accomplished by resistive heating or bias and electric potential to obtain an epitaxial morphology. A deposition dwell may be used to form an oxide epitaxial film from a metal or metal oxide target.

The oxide layer typically present on substrates can be removed by exposure of the substrate surface to energetic ions within a reducing environment, also known as Ion Beam etching. Ion Beam etching can be used to clean the substrate prior to film deposition, by removing residual oxide or impurities from the substrate, and producing an essentially oxide-free preferably biaxially textured substrate surface. This improves the contact between the substrate and subsequently deposited material. Energetic ions can be produced by various ion guns, for example, which accelerate ions such as $Ar^+$ toward a substrate surface. Preferably, gridded ion sources with beam voltages greater than 150 eV are utilized. Alternatively, a plasma can be established in a region near the substrate surface. Within this region, ions chemically interact with a substrate surface to remove material from that surface, including metal oxides, to produce substantially oxide-free metal surface.

Another method to remove oxide layers from a substrate is to electrically bias the substrate. If the substrate is made negative with respect to the anode potential, it will be subjected to a steady bombardment by ions from the gas prior to the deposition (if the target is shuttered) or during the entire film deposition. This ion bombardment can clean the substrate surface of absorbed gases that might otherwise be incorporated in the film and also heat the substrate to elevated deposition temperatures. Such ion bombardment can be further advantageous by improving the density or smoothness of the epitaxial film.

Upon formation of an appropriately textured, substantially oxide-free substrate surface, deposition of a buffer layer can begin. One or more buffer layers, each including a single metal or oxide layer, can be used. In some preferred embodiments, the substrate is allowed to pass through an apparatus adapted to carry out steps of the deposition method of these embodiments. For example, if the substrate is in the form of a tape, the substrate can be passed linearly from a payout reel to a take-up reel, and steps can be performed on the substrate as it passes between the reels.

According to some embodiments, substrate materials are heated to elevated temperatures which are less than about 90% of the melting point of the substrate material but greater than the threshold temperature for forming an epitaxial layer of the desired material on the substrate material in a vacuum environment at the predetermined deposition rate. In order to form the appropriate buffer layer crystal structure and buffer layer smoothness, high substrate temperatures are generally preferred. Typical lower limit temperatures for the growth of oxide layers on metal are approximately 200° C. to 800° C., preferably 500° C. to 800° C., and more preferably, 650° C. to 800° C. Various well-known methods such as radiative heating, convection heating, and conduction heating are suitable for short (2 cm to 10 cm) lengths of substrate, but for longer (1 m to 100 m) lengths, these techniques may not be well suited. Also to obtain desired high throughput rates in a manufacturing process, the substrate must be moving or transferring between deposition stations during the process. According to particular embodiments, the substrates are heated by resistive heating, that is, by passing a current through the metal substrate, which is easily scaleable to long length manufacturing processes. This approach works well while instantaneously allowing for rapid travel between these zones. Temperature control can be accomplished by using optical pyrometers and closed loop feedback systems to control the power supplied to the substrate being heated. Current can be supplied to the substrate by electrodes that contact the substrate in at least two different segments of the substrate. For example, if the substrate, in the form of a tape, is passed between reels, the reels themselves could act as electrodes. Alternatively, if guides are employed to transfer the substrate between reels, the guides could act as electrodes. The electrodes could also be completely independent of any guides or reels as well. In some preferred embodiments, current is applied to the substrate tape between current wheels.

In order that the deposition is carried out on a substrate that is at the appropriate temperature, the metal or oxide material that is deposited onto the substrate is desirably deposited in a region between the current wheels. Because the current wheels can be efficient heat sinks and can thus cool the tape in regions proximate to the wheels, material is desirably not deposited in regions proximate to the wheels. In the case of sputtering, the charged material deposited onto the substrate is desirably not influenced by other charged surfaces or materials proximate to the sputter flux path. For this reason, the sputter chamber is preferably configured to place components and surfaces which could influence or deflect the sputter flux, including chamber walls, and other deposition elements, in locations distant from the deposition zone so that they do not alter the desired linear flux path and deposition of metal or metal oxide in regions of the tape at the proper deposition temperature.

More details are provided in commonly owned U.S. patent application Ser. No. 09/500,701, filed on Feb. 9, 2000, and entitled "Oxide Layer Method," and commonly owned U.S. patent application Ser. No. 09/615,669, filed on Jul. 14, 2000, and entitled "Oxide Layer Method," both of which are hereby incorporated by reference in their entirety.

In preferred embodiments, three buffer layers are used. A layer of $Y_2O_3$ or $CeO_2$ (e.g., from about 20 nanometers to about 75 nanometers thick) is deposited (e.g., using electron beam evaporation) onto the substrate surface. A layer of YSZ (e.g., from about 0.20 nanometers about 700 nanometers thick, such as about 75 nanometers thick) is deposited onto the surface of the $Y_2O_3$ or $CeO_2$ layer using sputtering (e.g., using magnetron sputtering). A $CeO_2$ layer (e.g., about 20 nanometers thick) is deposited (e.g., using magnetron sputtering) onto the YSZ surface. The surface of one or more of these layers can be chemically and/or thermally conditioned as described herein.

In certain embodiments, a buffer layer material can be prepared using solution phase techniques, including metal-organic deposition, which is known to those skilled in the art. Such techniques are disclosed in, for example, S. S. Shoup et al., J. Am. Cer. Soc., Vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527.

In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

In certain embodiments, the buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

The formation of oxide buffer layers can be carried out so as to promote wetting of an underlying substrate layer. Additionally, in particular embodiments, the formation of metal oxide layers can be carried out using metal alkoxide or carboxylate precursors (for example, "sol gel" precursors).

As described above, if desired, the buffer layer or layers can be patterned either during or subsequent to their deposition.

Precursor Layer

Once the textured substrate including buffer layers is prepared, a precursor solution is deposited at a station as described above. One or more layers are deposited to form a precursor layer having the desired thickness and overall composition.

Suitable precursor components include soluble compounds of one or more rare earth elements, one or more alkaline earth metals and one or more transition metals. As used herein, "soluble compounds" of rare earth elements, alkaline earth metals and transition metals refers to compounds of these metals that are capable of dissolving in the solvents contained in the precursor solution. Such compounds include, for example, salts (e.g., nitrates, acetates, alkoxides, halides, sulfates, and trifluoroacetates), oxides and hydroxides of these metals. At least one of the compounds is a fluorine-containing compound, such as the trifluoroacetate.

Examples of metal salt solutions that can be used are as follows.

In some embodiments, the metal salt solution can have a relatively small amount of free acid. In aqueous solutions, this can correspond to a metal salt solution with a relatively neutral pH (e.g., neither strongly acidic nor strongly basic). The metal salt solution can be used to prepare multi-layer superconductors using a wide variety of materials that can be used as the underlying layer on which the superconductor layer is formed.

The total free acid concentration of the metal salt solution can be less than about $1 \times 10^{-3}$ molar (e.g., less than about $1 \times 10^{-5}$ molar or about $1 \times 10^{-7}$ molar). Examples of free acids that can be contained in a metal salt solution include trifluoroacetic acid, acetic acid, nitric acid, sulfuric acid, acids of iodides, acids of bromides and acids of sulfates.

When the metal salt solution contains water, the precursor composition can have a pH of at least about 3 (e.g., at least about 5 or about 7).

In some embodiments, the metal salt solution can have a relatively low water content (e.g., less than about 50 volume percent water, less than about 35 volume percent water, less than about 25 volume percent water).

In general, the rare earth metal salt can be any rare earth metal salt that is soluble in the solvent(s) contained in the precursor solution and that, when being processed to form an intermediate (e.g., a metal oxyhalide intermediate), forms rare earth oxide(s) (e.g., $Y_2O_3$). The rare earth elements may be selected from the group of yttrium, cerium, neodymium, samarium, europium, gadolinium, terbium, dysprosium, holmium, erbium, thulium, ytterbium, and lutetium. Typically, the alkaline earth metal is barium, strontium or calcium. Such salts can have, for example, the formula $M(O_2C—(CH_2)_n—CXX'X'')(O_2C—(CH_2)_m—CX'''X''''X''''')(O_2C—(CH_2)_p—CX''''''X'''''''X'''''''')$ or $M(OR)_3$. M is the rare earth metal. n, m and p are each at least one but less than a number that renders the salt insoluble in the solvent(s) (e.g., from one to ten). Each of X, X', X'', X''', X'''', X''''', X'''''', X''''''' and X'''''''' is H, F, Cl, Br or I. R is a carbon containing group, which can be halogenated (e.g., $CH_2CF_3$) or nonhalogenated. Examples of such salts include nonhalogenated carboxylates, halogenated acetates (e.g., trifluoroacetate, trichloroacetate, tribromoacetate, triiodoacetate), halogenated alkoxides, and nonhalogenated alkoxides. Examples of such nonhalogenated carboxylates include nonhalogenated acetates (e.g., $M(O_2C—CH_3)_3$). Generally, the alkaline earth metal salt can be any alkaline earth metal salt that is soluble in the solvent(s) contained in the precursor solution and that, when being processed to form an intermediate (e.g., a metal oxyhalide intermediate), forms an alkaline earth halide compound (e.g., $BaF_2$, $BaCl_2$, $BaBr_2$, $BaI_2$) prior to forming alkaline earth oxide(s) (e.g., BaO). Such salts can have, for example, the formula $M'(O_2C—(CH_2)_n—CXX'X'')(O_2C—(CH_2)_m—CX'''X''''X''''')$ or $M'(OR)_2$. M' is the alkaline earth metal. n and m are each at least one but less than a number that renders the salt insoluble in the solvent(s) (e.g., from one to ten). Each of X, X', X'', X''', X'''' and X''''' is H, F, Cl, B or, I. R can be a halogenated or nonhalogenated carbon containing group. Examples of such salts include halogenated acetates (e.g., trifluoroacetate, trichloroacetate, tribromoacetate, triiodoacetate). Generally, the transition metal is copper. The transition metal salt should be soluble in the solvent(s) contained in the precursor solution. In one or more embodiments of the present invention, the rare earth and the alkaline earth elements can form a metal or mixed metal oxyfluoride in place of or in addition to a rare earth oxide and an alkaline earth fluoride.

Suitable copper precursor solutions contain a copper salt that is soluble at the appropriate concentration in the solvent(s). Such compounds include copper nitrates, carboxylates, alkoxides, halides, sulfates or trifluoroacetates. Preferably, during conversion of the precursor to the intermediate (e.g., metal oxyhalide), minimal cross-linking occurs between discrete transition metal molecules (e.g., copper molecules). Such transition metals salts can have, for example, the formula $M''(CXX'X''—CO(CH)_aCO—CX'''X''''X''''')(CX''''''X'''''''X''''''''—CO(CH)_bCOCX'''''''''X''''''''''X'''''''''')$, $M''(O_2C—(CH_2)_n—CXX'X'')(O_2C—(CH_2)_m—CX'''X''''X''''')$ or $M''(OR)_2$. M'' is the transition metal. a and b are each at least one but less than a number that renders the salt insoluble in the solvent(s) (e.g., from one to five). Generally, n and m are each at least one but less than a number that renders the salt insoluble in the solvent(s) (e.g., from one to ten). Each of X, X', X'', X''', X'''', X''''', X'''''', X''''''', X'''''''', X''''''''', X'''''''''' is H, F, Cl, Br or I. R is a carbon containing group, which can be halogenated (e.g., $CH_2CF_3$) or nonhalogenated. These salts include, for example, nonhalogenated acetates (e.g., $M''(O_2C—CH_3)_2$), halogenated acetates, halogenated alkoxides, and nonhalogenated alkoxides. Examples of such salts include copper trichloroacetate, copper tribromoacetate, copper triiodoacetate, $Cu(CH_3COCHCOCF_3)_2$, $Cu(OOCC_7H_{15})_2$, $Cu(CF_3COCHCOF_3)_2$, $Cu(CH_3COCHCOCH_3)_2$, $Cu(CH_3CH_2CO_2CHCOCH_3)_2$, $CuO(C_5H_6N)_2$ and $Cu_3O_3Ba_2(O—CH_2CF_3)_4$. A suitable compound is copper proprionate. An example of a nonhalogenated propionate salt of a transition metal is $Cu(O_2CC_2H_5)_2$. In some embodiments, the transition metal salt is a simple salt, such as copper sulfate, copper nitrate, copper iodide and/or copper oxylate. In some embodiments, n and/or m can have the value zero. In certain embodiments, a and/or b can have the value zero. An illustrative and nonlimiting list of Lewis bases includes nitrogen-containing compounds, such as ammonia and amines. Examples of amines include $CH_3CN$, $C_5H_5N$ and $R_1R_2R_3N$. Each of $R_1R_2R_3$ is independently H, an alkyl group (e.g., a straight chained alkyl group, a branched alkyl group, an aliphatic alkyl group, a non-aliphatic alkyl group and/or a substituted alkyl group) or the like. Without wishing to be bound by theory, it is believed that the presence of a Lewis base in the metal salt solution can reduce cross-linking of copper during intermediate formation. It is believed that this is achieved because a Lewis base can coordinate (e.g., selective coordinate) with copper ions, thereby reducing the ability of copper to cross-link.

While the precursor solution typically contains stoichiometric amounts of the component metal compounds, i.e., 3:2:1 Cu:Ba:RE, in some embodiments an excess of copper or a deficiency of barium is used. The ratio of the transition metal to the alkaline earth metal can be greater than 1.5, and the precursor solution can include at least about 5 mol % excess copper, or at least about 20 mol % excess copper.

In addition to precursor components for the formation of a rare-earth/alkaline-earth-metal/transition-metal oxide, the precursor solution may include additive components and/or dopant components for the formation of flux pinning sites is used in a solution-based method to obtain a superconducting film having pinning centers. The additive compound can be metal compounds, such as soluble compounds of rare earths, alkaline earths or transition metals, cerium, zirconium, silver, aluminum, or magnesium, that form metal oxide or metal in the oxide superconductor film. The precursor solution can provide a dopant metal that partially substitutes for a metal of the precursor component of the precursor solution. Generally, a dopant component can be any metal compound that is soluble in the solvent(s) contained in the precursor solution and that, when processed to form an oxide superconductor, provided a dopant metal that substitutes for an element of the oxide superconductor.

The solvent or combination of solvents used in the precursor solution can include any solvent or combination of solvents capable of dissolving the metal salts (e.g., metal carboxylate(s)). Such solvents include, for example, alcohols or acids, including methanol, ethanol, isopropanol and butanol, propionic acid or water.

In embodiments in which the metal salt solution contains trifluoroacetate ion and an alkaline earth metal cation (e.g., barium), the total amount of trifluoroacetate ion can be selected so that the mole ratio of fluorine contained in the metal salt solution (e.g., in the form of trifluoroacetate) to the alkaline earth metal (e.g., barium ions) contained in the metal salt solution is at least about 2:1 (e.g., from about 2:1 to about 18.5:1, or from about 2:1 to about 10:1).

The methods of disposing the superconducting composition on the underlying layer (e.g., on a surface of a substrate, such as a substrate having an alloy layer with one or more buffer layers disposed thereon) include spin coating, dip coating, slot coating, web coating and other techniques known in the art.

Decomposition of the Precursor Layer

At a subsequent station, the precursor components are decomposed. The conversion of the precursor components into an oxide superconductor is carried out as has been previously reported for continuous thick precursor films. In the case of precursor components including at least one fluoride-containing salt, the first step of the heating step is performed to decompose the metalorganic molecules to one or more oxyfluoride intermediates of the desired superconductor material.

An intermediate oxyfluoride film is considered to be any film that is a precursor to a rare earth metal-alkaline earth metal-transition metal oxide superconductor (hereinafter "RE-123") film that is comprised of (1) a mixture of $BaF_2$, a rare earth oxide or fluoride and/or transition metal, transition metal oxide or transition metal fluoride, (2) a mixture of a compound comprised of a RE-Ba—O—F phase, a rare earth oxide or fluoride and/or transition metal oxide or fluoride, or (3) as a mixture of a compound comprised of a Ba—O—F phase, rare earth oxides or fluorides and/or transition metal oxide or fluoride. The intermediate film can then be further processed to form a RE-123 oxide superconductor film. The oxide superconductor film also indicates a small, but detectable, fluoride residue.

Typically, the initial temperature in this step is about room temperature, and the final temperature is from about 190° C. to about 210° C., preferably to a temperature to about 200° C. Preferably, this step is performed using a temperature ramp of at least about 5° C. per minute, more preferably a temperature ramp of at least about 10° C. per minute, and most preferably a temperature ramp of at least about 15° C. per minute. During this step, the partial pressure of water vapor in the nominal gas environment is preferably maintained at from about 5 torr to about 50 torr, more preferably at from about 5 torr to about 30 torr, and most preferably at from about 20 torr to about 30 torr. The partial pressure of oxygen in the nominal gas environment is maintained at from about 0.1 torr to about 760 torr and preferably at about 730-740 torr.

Heating is then continued to a temperature of from about 200° C. to about 290° C. using a temperature ramp of from about 0.05° C. per minute to about 5° C. per minute (e.g., from about 0.5° C. per minute to about 1° C. per minute). Preferably, the gas environment during this heating step is substantially the same as the nominal gas environment used when the sample is heated to from the initial temperature to from about 190° C. to about 215° C.

Heating is further continued to a temperature of about 650° C., or more preferably to a temperature of about 400° C., to form the oxyfluoride intermediate. This step is preferably performed using a temperature ramp of at least about 2° C. per minute, more preferably at least about 3° C. per minute, and most preferably at least about 5° C. per minute. Preferably, the gas environment during this heating step is substantially the same as the nominal gas environment used when the sample is heated to from the initial temperature to from about 190° C. to about 215° C.

In alternate embodiments, barium fluoride is formed by heating the dried solution from an initial temperature (e.g., room temperature) to a temperature of from about 190° C. to about 215° C. (e.g., about 210° C.) in a water vapor pressure of from about 5 torr to about 50 torr water vapor (e.g., from about 5 torr to about 30 torr water vapor, or from about 10 torr to about 25 torr water vapor). The nominal partial pressure of oxygen can be, for example, from about 0.1 torr to about 760 torr. In these embodiments, heating is then continued to a temperature of from about 220° C. to about 290° C. (e.g., about 220° C.) in a water vapor pressure of from about 5 torr to about 50 torr water vapor (e.g., from about 5 torr to about 30 torr water vapor, or from about 10 torr to about 25 torr water vapor). The nominal partial pressure of oxygen can be, for example, from about 0.1 torr to about 760 torr. This is followed by heating to about 400° C. at a rate of at least about 2° C. per minute (e.g., at least about 3° C. per minute, or at least about 5° C. per minute) in a water vapor pressure of from about 5 torr to about 50 torr water vapor (e.g., from about 5 torr to about 30 torr water vapor, or from about 10 torr to about 25 torr water vapor) to form barium fluoride. The nominal partial pressure of oxygen can be, for example, from about 0.1 torr to about 760 torr.

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 torr, a predetermined partial pressure of water vapor (e.g. at least about 10 torr, at least about 15 torr, at most about 25 torr, at most about 20 torr, about 17 torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

The foregoing treatments of a metal salt solution can result in an oxyfluoride intermediate film in which the constituent metal oxides and metal fluorides are homogeneously distributed throughout the film. Preferably, the precursor has a relatively low defect density and is essentially free of cracks through the intermediate thickness. While solution chemistry for barium fluoride formation has been disclosed, other methods can also be used for other precursor solutions.

Forming the Oxide Superconductor

The superconductor intermediate film can then be heated to form the desired superconductor layer at a further processing station. Typically, this step is performed by heating from about room temperature to a temperature of from about 700° C. to about 825° C., preferably to a temperature of about 740° C. to 800° C. and more preferably to a temperature of about 750° C. to about 790° C., at a temperature ramp of about greater than 25° C. per minute, preferably at a temperature rate of about greater than 100° C. per minute and more preferably at a temperature rate about greater than 200° C. per minute. This step can also start from the final temperature of about 400-650° C. used to form the intermediate oxyfluoride film. During this step, a process gas is flowed over the film surface to supply the gaseous reactants to the film and to remove the gaseous reaction products from the film. The nominal gas environment during this step has a total pressure of about 0.1 torr to about 760 torr and is comprised of about 0.09 torr to about 50 torr oxygen and about 0.01 torr to about 150 torr water vapor and about 0 torr to about 750 torr of an inert gas (nitrogen or argon). More preferably, the nominal gas environment has a total pressure of about 0.15 torr to about 5 torr and includes about 0.1 torr to about 1 torr oxygen and about 0.05 torr to about 4 torr water vapor.

The film is then held at a temperature of about 700° C.-825° C., preferably at a temperature of about 740° C. to 800° C. and more preferably at a temperature of about 750° C. to about 790° C., for a time of about at least 5 minutes to about 120 minutes, preferably for a time of at least about 15 minutes to about 60 minutes, and more preferably for a time of at least about 15 minutes to about 30 minutes. During this step, a process gas is flowed over the film surface to supply the gaseous reactants to the film and to remove the gaseous reaction products from the film. The nominal gas environment during this step has a total pressure of about 0.1 torr to about 760 torr and is comprised of about 0.09 torr to about 50 torr oxygen and about 0.01 torr to about 150 torr water vapor and about 0 torr to about 750 torr of an inert gas (nitrogen or argon). More preferably, the nominal gas environment has a total pressure of about 0.15 torr to about 5 torr and is comprised of about 0.1 torr to about 1 torr oxygen and about 0.05 torr to about 4 torr water vapor.

The film is then cooled to room temperature in a nominal gas environment with an oxygen pressure of about 0.05 torr to about 150 torr, preferably about 0.1 torr to about 0.5 torr and more preferably from about 0.1 torr to about 0.2 torr.

The resultant superconductor layer is well ordered (e.g., biaxially textured in plane, or c-axis out of plane and biaxially textured in plane). In embodiments, the bulk of the superconductor material is biaxially textured. A superconductor layer can be at least about one micrometer thick (e.g., at least about two micrometers thick, at least about three micrometers thick, at least about four micrometers thick, at least about five micrometers thick). The oxide superconductor has a c-axis orientation that is substantially constant across its width, the c-axis orientation of the superconductor being substantially perpendicular to the surface of the wire or tape.

The superconductor layer can also be deposited in-situ (no precursor deposition and separate reaction steps) by laser ablation, MOCVD, or other techniques known in the art.

Further Processing

Further processing by cap layer deposition, oxygen anneal, and splicing to a second wire are carried out. By splicing wires together using low resistance, mechanically robust joints, wires of length that is useable in a current carrying application without damage to the brittle oxide superconductor film are produced.

EXAMPLES

Low resistance, low profile, two-sided splices were made to connect thick reinforced YBCO coated conductor tapes (i.e., the HTS wires as illustrated in FIGS. 2-6). The exemplary spliced wires had brass, copper or stainless steel laminate strips, and were formed with a variety of solders, as described in greater detail below. Some splices also were made with YBCO wires comprised of Superpower, Inc. wire, a substrate, buffer, YBCO system, with the substrate being HASTELLOY, a corrosion resistant alloy manufactured by Haynes International, Inc. (Kokomo, Ind.), a 3.0 micron Ag layer and an optional Cu layer with a thickness from about 1 micrometers to about 50 micrometers, preferably between about 20 micrometers to about 30 micrometers.

Example 1

Basic Architectures and Materials

A variety of two-sided splice joints, were made and tested, with different backing and HTS strap materials as described in Table 2. The basic architectures described in Table 2 were fabricated and evaluated. Table 2 lists the various examples, sample ranges and contemplated ranges for the various examples.

TABLE 2

Two-sided splice material and architecture variations

| Example 1 | | Sample ranges | Contemplated range |
|---|---|---|---|
| Taper | Length | 4.5-5.5 cm | 0.4-10 cm |
| | Taper mate | <1 mm gap | <2 mm gap anywhere across gap normal to taper edge |
| Thick laminated tape sample structures | Tape thickness | 0.62 +/− 0.03 mm<br>0.4 +/− 0.04 mm<br>0.3 +/− 0.03 mm | 0.25 mm to 1.1 mm |
| Thick laminated tape laminate materials | Description | 316 L Stainless (SS)<br>Brass (Cu—Zn) | Metals or alloys containing Cu, Zn, Pb, Ag, Sn, Ni, Fe, Cr, Al, compositions commonly called brass, stainless steel, monel, superalloys |
| Thick tape build (3-ply) | $1^{st}$ laminate layer - thicknesses used | 0.15 +/− 0.01 mm<br>0.25 +/− 0.015 mm<br>0.10 +/− 0.005 mm | 0.075 mm to 0.5 mm |
| | Lamination solder | <7 um Sn—Pb—Ag | 0.1 um to 10 um |
| | Gap layer | 3.0 +/− 1.5 um Ag | Ag, Cu, 0 um to 5 um (optional) |
| | Substrate | 75 +/− 5 um Ni—W | Ni—W alloy, Hastalloy, Invar, 25 to 125 um |
| | HTS film | 0.8 to 1.4 um YBCO | Re—Ba—Cu—O film, 0.8 to 3 um range |
| | Ag gap layer | 3 +/− 1.5 um | Ag, Cu, 0 um to 5 um (optional) |
| | $2^{nd}$ laminate layer - thicknesses used | As for $1^{st}$ layer bove | As for $1^{st}$ layer above |

TABLE 2-continued

Two-sided splice material and architecture variations

| Example 1 | | Sample ranges | Contemplated range |
|---|---|---|---|
| Stainless laminated HTS strap (3-ply) | Stainless laminate layer thicknesses | 0.025 +/− 0.005 mm | 0.012 mm to 0.10 mm |
| | Lamination solder | <7 um Sn—Pb—Ag | 0.1 um to 10 um |
| | gap layer | 3.0 +/− 1.5 um Ag | Ag, Cu, 0 um to 5 um (optional) |
| | Substrate | 75 +/− 5 um Ni—W | Ni—W alloy, Hastalloy, Invar, 25 to 125 um |
| | HTS film | 0.8 to 1.4 um YBCO | Re—Ba—Cu—O film, 0.8 to 3 um range |
| | Ag gap layer | 3 +/− 1.5 um | Ag, Cu, 0 um to 5 um (optional) |
| Copper laminated HTS strap (3-ply) | Copper laminate Layer thickness | 0.50 +/− 0.005 mm | 0.012 mm to 0.10 mm |
| | Rest as for Stainless above | As above | As above |
| Non laminated HTS strap | Outer gap layers | 25 +/− 10 um Cu | Cu, Ag, 0 to 50 um |
| | Inner gap layer | 3 +/− 2 um Ag | Ag, Cu, 0 um to 5 um (optional) |
| | Substrate | 75 +/− 5 um Hastalloy | Alloys containing Ni, W, Cr, Fe, Cu, Zn, Co, Al |
| | HTS film | 0.8 to 1.4 um YBCO | Re—Ba—Cu—O film, 0.8-3 um YBCO |
| | Inner gap layer | 3 +/− 1.5 um Ag | Ag, Cu, 0 to 5 um |
| | Outer gap layer | 25 +/− 10 um Cu | Cu, Ag, 0 to 50 um |
| Normal metal back strap | Thickness | 0.100 +/− 0.005 mm  0.075 +/− 0.005 mm | 0.05-0.15 mm |
| | Laminate materials | 316 L stainless  Brass (Cu—Zn) | Range as above for thick laminated tape |

A variety of two-sided splice joints were fabricated with available materials described in Table 2, in order to demonstrate the feasibility of making the two-sided splice consisting of a back strap proximate to the first laminate layer of the first thick laminated wire end, and the first laminate layer of the second thick laminated wire end, mating tapers in the ends of the first and second thick laminated wire ends, and a first HTS strap in electrical communication with the second laminate of the first and second thick laminated HTS wires.

Several tests were completed on some of these samples in order to establish the geometric, mechanical and electrical properties of these two-sided splices. The results for these tests are discussed in more detail below.

Example 2

Two-Sided Splices

Spliced samples were made with the above described tapes (Table 2). The data in Table 3 illustrates the range of relative thicknesses and widths of the top and bottom straps. The table lists the various sample sets (1-11), the splice type, the materials for the thick laminated tapes, the HTS straps and the back straps, as well as their respective thicknesses and lengths. For example, as shown in the table, the back strap to HTS strap relative thicknesses were in the range of 52% to 100%. The straps were also all within the 90% to 105% width range relative to the thick laminated HTS tapes. Further, in table 3, SS represents a wire of 316L stainless steel, 3-ply represents a laminate—HTS—laminate wire structure; SP represents a HASTALLOY, a corrosion resistant alloy manufactured by Haynes International, Inc. (Kokomo, Ind.), substrate, HTS film, ~3 um Ag layer, ~25 um Cu outer layer per side wire; NM (normal metal) back strap widths are approximately 4.31 mm; thick laminated tape widths are approximately 4.4 mm; laminated HTS strap widths are about 4.4 mm; SP HTS strap width is about 4.0 mm and um is synonymous with micrometer.

TABLE 3

Splice sample sets studied, and key attributes

| Sample Set | Splice type | Thick lam tape Material | Thick lam tape Avg Thick (μm) | Thick HTS strap Material | HTS strap Lngth (cm) | HTS strap Thick (um) | Back strap Material | Back strap Length (cm) | Back strap Thick (um) | Back strap Thickness (%) relative to HTS strap | Widths HTS/back straps Straps are within 90-105% thick lam tape width |
|---|---|---|---|---|---|---|---|---|---|---|---|
| Set 1 Short, Thick SS | 3 ply HTS strap, NM back strap | 3 ply, 250 um SS/side | 620 | 3 ply, 25 um SS/side | 8 | 140 | SS | 6 | 100 | 71 | 100/98 |
| Set 2 Long Thick SS | 3 ply HTS strap, NM back strap | 3 ply, 250 um SS/side | 620 | 3 ply, 25 um SS/side | 24 | 140 | SS | 16 | 100 | 71 | 100/98 |

TABLE 3-continued

Splice sample sets studied, and key attributes

| Sample Set | Splice type | Thick lam tape Material | Thick lam tape Avg Thick (μm) | HTS strap Material | HTS strap Lngth (cm) | HTS strap Thick (um) | Back strap Material | Back strap Length (cm) | Back strap Thick (um) | Back strap Thickness (%) relative to HTS strap | Widths HTS/back straps Straps are within 90-105% thick lam tape width |
|---|---|---|---|---|---|---|---|---|---|---|---|
| Set 3 Short Thick Brass | 3 ply HTS strap, NM back strap | 3 ply, 150 um brass/side | 400 | 3 ply, 25 um SS/side | 8 | 140 | Brass | 6 | 75 | 54 | 100/98 |
| Set 4: Short Thick Brass | 1 ply HTS strap, NM back strap | 3 ply, 150 um brass/side | 400 | 1 ply, SP tape | 8 | 140 | Brass | 6 | 75 | 54 | 91/98 |
| Set 5: Short Thick Brass | 1 ply HTS thin strap, NM back | 3 ply, 150 um brass/side | 400 | 1 ply SP-5 um Cu | 8 | 90 | Brass | 6 | 75 | 83 | 91/98 |
| Set 6 Short Thick Brass | 2 ply HTS strap, NM back strap | 3 ply, 150 um brass/side | 400 | 2 ply, 25 um SS on side | 8 | 110 | Brass | 6 | 75 | 68 | 100/98 |
| Set 7 Short Thick Brass | 1 ply HTS Strap and back strap | 3 ply, 150 um brass/side | 400 | 1 ply, SP tape | 8 | 140 | 1 ply, SP tape | 6 | 140 | 100 | 91/91 |
| Set 8 | 3 ply HTS strap and back strap | 3 ply, 150 um brass/side | 400 | 3 ply, 25 um SS/side | 8 | 140 | 3 ply, 25 um SS/side | 6 | 140 | 100 | 100/100 |
| Set 9 4 ply, brass | 3 ply HTS strap and back strap-4 ply | 4 ply, 110 um brass/side | 400 | 3 ply, 25 um SS/side | 8 | 140 | 3 ply, 25 um SS/side | 6 | 140 | 100 | 100/100 |
| Set 10 4 ply | 1 ply HTS strap and back strap-4 ply | 4 ply, 110 um brass/side | 400 | 1 ply, SP tape | 8 | 140 | 1 ply, SP tape | 6 | 140 | 100 | 91/91 |
| Set 11 3 ply, CuLam HTS strap | 3 ply HTS strap, NM back strap | 3 ply, 250 um.SS/side | 620 | 3 ply, 50 um Cu/side | 8 | 190 | SS | 6 | 100 | 53 | 100/98 |

Table 4 lists the solder compositions used in the lamination and splicing of HTS wires and tapes according to the embodiments disclosed herein, along with the approximate melting points, tensile strength and resistivity at ambient temperature for each composition. The nominal values are listed for each composition. However, significant compositional variation can occur about these nominal values.

TABLE 4

Solder compositions studied for lamination and splicing

| Nominal Composition | Approximate Solidus Melting Temp (C.) | Approximate Tensile strength (MPa) | Resistivity at ambient μΩ-cm |
|---|---|---|---|
| 96.5Sn—3.5Ag | 221 | 55 | 12 |
| 95.5Sn—3.8Ag—0.7Cu | 217 | 48 | 13 |
| Sn—3.8Ag—0.7Cu—0.25Sb | 217 | 51 | 12 |
| 99.3Sn/0.7Cu | 227 | 45 | 13 |
| 95Sn/5Sb | 236 | 41 | 14. |
| In (99%) | 157 | <20 | 9 |
| Sn—37Pb—3Ag | 178 | 40 | 15 to 20 |

After the two-sided joints were made according to the embodiments disclosed herein, the two-sided joints underwent reliability testing. Reliability testing can mimic a critical condition of cabling or cable operation and establishes the critical condition's impact on HTS wire properties. The custom tests described below in Examples 4-6 define statistically acceptable conditions at which the wire will perform as required.

Example 3

Splice Pressurized Liquid Nitrogen ("LN2") Cycling or "Hermeticity" Test

This test is a relevant test for HTS wires because cabling exposes HTS wires to LN2 at up to 20 atm. Thus, it can be helpful to determine how well the HTS wire can withstand the cold temperatures and pressures. The test equipment consists of plates containing HTS wires, an inner LN2 tank containing the plates and pressurized LN2, and an outer tank containing LN2 at 1.0 atm to keep the pressurized tank at 77K.

Figure 8A:
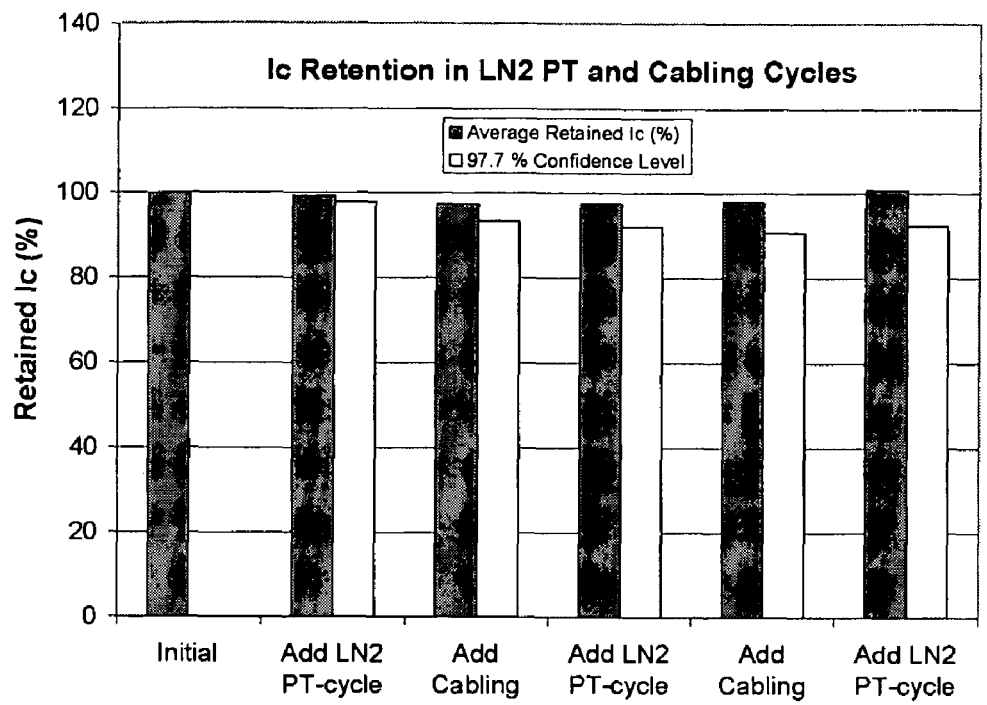
FIG. 8($a$) is a plot depicting Ic retention in LN2 PT and cabling cycles testing for an HTS wire, according to one or more embodiments of the present invention.
Figure 8B:
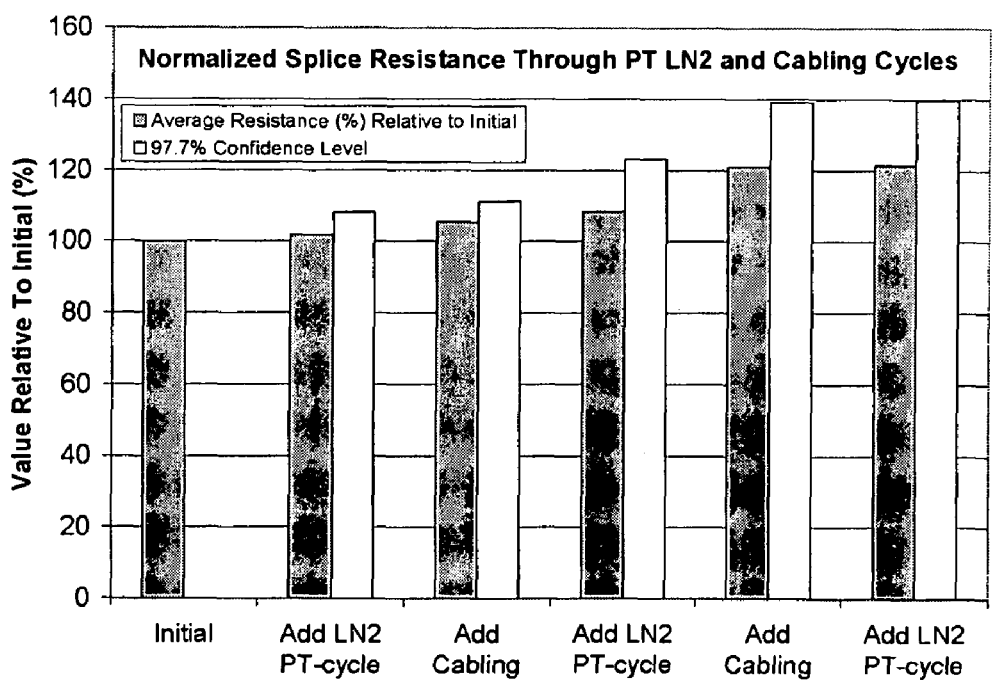

Splice wire samples from Set 1 in Table 3 (e.g., 620 micrometer thick laminated wire, 250 micrometer/side stainless; 25 micrometer SS/side 8 cm HTS strap, 100 micrometer thick 6 cm back strap, 5 cm taper) were subjected to cable reliability testing, including pressurized liquid nitrogen cycling to 30 atm for 16 hours, and simulated long length cabling cycles. Critical current ("Ic"), splice resistance and physical integrity were evaluated before and after each cycle. FIGS. 8(a) and 8(b) depict bar graphs of the reliability of the two-sided joint through cumulative liquid nitrogen pressure—temperature cycles and cabling cycles related to Ic retention, shown in FIG. 8(a), and resistance, shown in FIG. 8(b), where the average initial splice resistance was 1.8 micro ohms at 77 K, and average initial Ic was 87.3 A.

The effects of these tests on retained Ic are illustrated in FIG. 8(a), which represents Ic retention in LN2 pressure treatments ("PT") and cabling cycles. As shown in FIG. 8(a) the Ic of the HTS wires is not significantly degraded by the LN2 PT and cabling treatments. The first bar represents the average retained Ic percentage, while the second bar represents the 97.7% confidence level. Each set of bars represents a different measuring point throughout the cycling test, including LN2 PT cycles and cabling cycles.

FIG. 8(b) shows the normalized splice resistance through LN2 PT cabling cycles, where the measurements are normalized to the initial values. The first bar is the average resistance relative to the initial resistance. The second bar is the 97.7% confidence level. The data in FIG. 8(b) show a minor increase in splice resistance throughout the reliability treatments of LN2 PT and cabling cycles, but still below the 3 mico ohm level.

Example 4

Splice Cabling Test

A second test performed on the HTS wires was a splice cabling test. In this test, one meter lengths of spliced HTS tape were spiral-wound onto a cable former with Ic and splice resistance tested before and after cabling. The Ic and splice resistance were then correlated to tension, former diameter, and cabling pitch. A variation of this test also subjects long wires to simulated cable testing.

Figure 9A:
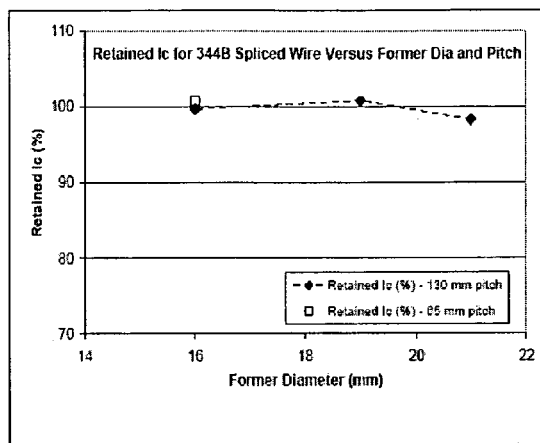
FIG. 9($a$) is graph of retained Ic vs. former diameter for a 0.4 mm thick brass laminated cable wire splice where the average initial Ic was 77.2 A, according to one or more embodiments of the present invention.
Figure 9B:
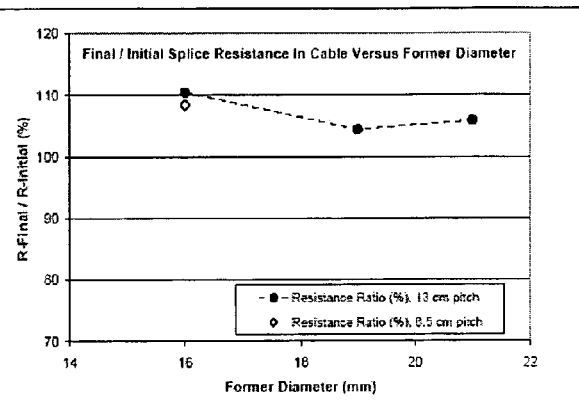

Splice wire samples from Set 3 in Table 3 (e.g., 400 micrometer thick laminated wire, 150 micrometer/side brass; 25 micrometer SS/side 8 cm HTS strap, 75 micrometer thick 6 cm back strap, 5 cm taper) were subjected to splice cabling tests. FIGS. 9(a) and 9(b) display the results of this test, where initial Ic was 77.2 A and splice resistance at 77K was 0.39 micro ohms. FIG. 9(a) is a graph of retained Ic % versus cable former diameter for a 130 mm pitch and a 65 mm pitch for a 344B brass laminated wire. FIG. 9(b) is a graph of the ratio of final resistance vs. initial resistance on the y-axis and former diameter on the x-axis for 13 cm pitch and a 6.5 cm pitch. The cabling limit of spliced 2G wire was not reached, as seen in FIG. 9(a), even on a 16 mm former with a 6.5 cm pitch. These data illustrate the mechanical suitability of 2G lamination reinforced wire, manufactured according the present invention, for cabling applications. Further, although splice resistance increased slightly, there was no evidence of splice damage in the testing.

Example 5

Tensile Load Testing

In this test, tensile loads of the strap materials used in making the spliced samples described in Table 3 were assessed as illustrated in Table 5. Table 5 lists the type of HTS strap, the type of back strap and the back strap load of 0.5% strain as compared to the HTS strap load at similar strain percentages. The ranges listed in Table 5 provided the two-sided splice configuration with improved bending characteristics, including the mitigation of kinking.

TABLE 5

Back strap to HTS strap tensile load ranges in samples up to 0.5% strain.

| HTS strap | Back strap | Back strap load at 0.5% strain compared to HTS strap load at similar strain (%) |
| --- | --- | --- |
| 25 um SS/side 3Ply | 100 um 316 L stainless | 100-150% |
| 25 um SS/side 3Ply | 75 um brass | 30-60% |
| 25 um SS/side 3Ply | 25 SS/side | 100% |
| 1 Ply, 140 um and copper | 75 um brass | 50-100% |

Alternate ways of making the joint include using a die that can hold both solder the wires together and form a ramp. This can replace the knifing technique.

Ultrasonic welding can be used in place of soldering wires to the top and bottom straps. Briefly, as is known to those of skill in the art, ultrasonic welding uses high-frequency oscillations, generated by a transducer (e.g., a piezoelectric transducer) to weld metal parts together. A sonotrode is used to induce oscillation of one workpiece against another, which creates a large amount of friction between the workpieces. This friction removes impurities at the workpiece surfaces, and causes metal at the surfaces to diffuse together, forming a bond without causing bulk heating of the workpiece.

Cold welding can also be used in place of soldering wires to the top and bottom straps. Systems and methods for cold welding metal layers are known in the art.

INCORPORATION BY REFERENCE

The following documents are hereby incorporated by reference in their entirety: U.S. Pat. No. 5,231,074, issued on Jul. 27, 1993, and entitled "Preparation of Highly Textured Oxide Superconducting Films from MOD Precursor Solutions;" U.S. Pat. No. 6,022,832, issued Feb. 8, 2000, and entitled "Low Vacuum Process for Producing Superconductor Articles with Epitaxial Layers;" U.S. Pat. No. 6,027,564, issued Feb. 22, 2000, and entitled "Low Vacuum Process for Producing Epitaxial Layers;" U.S. Pat. No. 6,190,752, issued Feb. 20, 2001, and entitled "Thin Films Having Rock-Salt-Like Structure Deposited on Amorphous Surfaces;" U.S. Pat. No. 6,537,689, issued Mar. 25, 2003, and entitled "Multi-Layer Superconductor Having Buffer Layer With Oriented Termination Plane;" PCT Publication No. WO 00/58530, published on Oct. 5, 2000, and entitled "Alloy Materials;" PCT Publication No. WO/58044, published on Oct. 5, 2000, and entitled "Alloy Materials;" PCT Publication No. WO 99/17307, published on Apr. 8, 1999, and entitled "Substrates with Improved Oxidation Resistance;" PCT Publication No. WO 99/16941, published on Apr. 8, 1999, and entitled "Substrates for Superconductors;" PCT Publication No. WO 98/58415, published on Dec. 23, 1998, and entitled "Controlled Conversion of Metal Oxyfluorides into Superconducting Oxides;" PCT Publication No. WO 01/11428, published on Feb. 15, 2001, and entitled "Multi-Layer Articles and Methods of Making Same;" PCT Publication No. WO 01/08232, published on Feb. 1, 2001, and entitled "Multi-Layer Articles And Methods Of Making Same;" PCT Publication No. WO 01/08235, published on Feb. 1, 2001, and entitled "Methods And Compositions For Making A Multi-Layer Article;" PCT Publication No. WO 01/08236, published on Feb. 1, 2001, and entitled "Coated Conductor Thick Film Precursor;" PCT Publication No. WO 01/08169, published on Feb. 1, 2001, and entitled "Coated Conductors With Reduced A.C. Loss;" PCT Publication No. WO 01/15245, published on Mar. 1, 2001, and entitled "Surface Control Alloy Substrates And Methods Of Manufacture Therefore;" PCT Publication No. WO 01/08170, published on Feb. 1, 2001, and entitled "Enhanced Purity Oxide Layer Formation;" PCT Publication No. WO 01/26164, published on Apr. 12, 2001, and entitled "Control of Oxide Layer Reaction Rates;" PCT Publication No. WO 01/26165, published on Apr. 12, 2001, and entitled "Oxide Layer Method;" PCT Publication No. WO 01/08233, published on Feb. 1, 2001, and entitled "Enhanced High Temperature Coated Superconductors;" PCT Publication No. WO 01/08231, published on Feb. 1, 2001, and entitled "Methods of Making A Superconductor;" PCT Publication No. WO 02/35615, published on Apr. 20, 2002, and entitled "Precursor Solutions and Methods of Making Same;" PCT Publication No. WO 2005/121414, published on Dec. 22, 2005, and entitled "Deposition of Buffer Layers on Textured Metal Surfaces;" PCT Publication No. WO 2005/081710, published on Sep. 9, 2005, and entitled "Oxide Films with Nanodot Flux Pinning Centers;" U.S. Pat. No. 6,436,317, issued on Aug. 20, 2002, and entitled, "Oxide Bronze Compositions And Textured Articles Manufactured In Accordance Therewith;" U.S. Provisional Patent Application Ser. No. 60/309,116, filed on Jul. 31, 2001, and entitled "Multi-Layer Superconductors And Methods Of Making Same;" U.S. Pat. No. 6,797,313, issued on Sep. 28, 2004, and entitled "Superconductor Methods and Reactor;" U.S. Provisional Patent Application Ser. No. 60/308,957, filed on Jul. 31, 2001, and entitled "Superconductor Methods and Reactors;" U.S. Provisional Patent Application Ser. No. 60/166,297, filed on Nov. 18, 1999, and entitled "Superconductor Articles and Compositions and Methods for Making Same;" U.S. Pat. No. 6,974,501, issued on Dec. 13, 2005, and entitled "Superconductor Articles and Compositions and Methods for Making Same;" U.S. patent application Ser. No. 10/955,866, filed on Sep. 29, 2004, and entitled "Dropwise Deposition of a Patterned Oxide Superconductor;" U.S. patent application Ser. No. 11/241,636, filed on Sep. 30, 2005, and entitled "Thick Superconductor Films with Improved Performance;" U.S. patent application Ser. No. 10/955,875, filed on Sep. 29, 2004, and entitled "Low AC Loss Filamentary Coated Superconductors;" U.S. patent application Ser. No. 10/955,801, filed on Sep. 29, 2004, and entitled "Stacked Filamentary Coated Superconductors;'" U.S. Provisional patent application Ser. No. 60/667,001, filed on Mar. 31, 2005, and entitled "Mesh-Type Stabilizer for Filamentary Coated Superconductors;" U.S. patent application Ser. No. 11/193,262, filed on Jul. 29, 2005, and entitled "Architecture for High Temperature Superconducting Wire;" U.S. Provisional patent application Ser. No. 60/703,815, filed Jul. 29, 2005, and entitled "High Temperature Superconducting Wires and Coils;" U.S. Provisional patent application Ser. No. 60/703,836, filed Jul. 29, 2005, and entitled "Thick Superconductor Films With Improved Performance;" PCT Publication No. WO 06/021003, published on Aug. 19, 2005, and entitled "Stacked Filamentary Coated Superconductors;" PCT Publication No. WO 06/023826, published on Aug. 19, 2005, and entitled "Low AC Loss Filamentary Coated Superconductors;" U.S. Provisional patent application Ser. No. 60/757,855, filed Jan. 10, 2006, and entitled "Method of Patterning Oxide Superconducting Films;" U.S. patent application Ser. No. 11/393,626, filed Mar. 30, 2006, and entitled "Mesh0Type Stabilizer for Filamentary Coated Superconductors;" U.S. patent application Ser. No. 11/490,779, filed Jul. 21, 2006, and entitled "Fabrication of Sealed High Temperature Superconductor Wires;" U.S. Provisional patent application Ser. No. 60/832,716, filed Jul. 21, 2006, and entitled "High Current, Compact Flexible Conductors Containing High Temperature Superconducting Tapes;" U.S. Provisional patent application Ser. No. 60/832,724, filed Jul. 21, 2006, and entitled "Low Resistance Splice for High Temperature Superconductor Wires;" U.S. Provisional patent application Ser. No. 60/832,871, filed Jul. 25, 2006, and entitled "High Temperature Superconductors Having Planar Magnetic Flux Pinning Centers and Methods For Making The Same;" U.S. Provisional patent Application Ser. No. 60/866,148, filed Nov. 16, 2006, and entitled "Electroplated High-Resistivity Stabilizers In High Temperature Superconductors And methods Thereof;" U.S. patent application Ser. No. 11/728,108, filed Mar. 23, 2007, and entitled "Systems and Methods For Solution-Based Deposition of Metallic Cap Layers For High Temperature Superconductor Wires;" U.S. Provisional patent application Ser. No. 60/922,145, filed Apr. 6, 2007, and entitled "Composite Substrates For High Temperature Superconductors Having Improved Properties;" U.S. patent application Ser. No. 11/880,586 filed on Jul. 23, 2007 entitled "Low Resistance Splice For High Temperature Superconductor Wires;" and U.S. patent application Ser. No. 60/832,724 filed on Jul. 21, 2006 entitled "Low-Resistance Splice for High Temperature Superconductor Wires.

The invention may be embodied in other specific forms without departing from the spirit or essential characteristics thereof. The present embodiments are therefore to be considered in respects as illustrative and not restrictive.

What is claimed is:

1. A two-sided joint for a HTS laminated wire comprising:
   a first laminated HTS wire having a tapered end across the width of the first laminated wire and comprising a first laminate layer, a substrate layer overlaying the first laminate layer, a buffer layer overlaying the substrate layer, a superconductor layer overlaying the buffer layer, a gap layer overlaying the buffer layer, and a second laminate layer overlaying the gap layer;
   a second laminated HTS wire having a tapered end across the width of the second laminated wire and comprising a first laminate layer, a substrate layer overlaying the first laminate layer, a buffer layer overlaying the substrate layer, a superconductor layer overlaying the buffer layer, a gap layer overlaying the superconductor layer, and a second laminate layer overlaying the gap layer, wherein the tapered end of the first laminated HTS wire is adjacent to and mated with the tapered end of the second laminated HTS wire;
   a first HTS strap in electrical communication with the second laminate layer of the first laminated HTS wire and the second laminate layer of the second laminated HTS wire; and
   a backing strap proximate to the first laminate layer of the first laminated HTS wire and the first laminate layer of the second laminated HTS wire.

2. The two-sided joint of claim 1, wherein the first HTS strap comprises a gap layer, a superconductor layer overlaying the gap layer, a buffer layer overlaying the superconductor layer, and a substrate layer overlaying the buffer layer, wherein the gap layer is adjacent to and in electrical communication with the second laminate layer of the first laminated HTS wire and the second laminate layer of the second laminated HTS wire.

3. The two-sided joint of claim 2, wherein the first HTS strap further comprises a laminate layer overlaying the substrate layer.

4. The two-sided joint of claim 3, wherein the first HTS strap further comprises a second laminate layer interposed between the electrically conductive gap layer and the first and second HTS wires.

5. The two-sided joint of claim 1, wherein the backing strap is selected to be within about 50% and about 150% of the thickness of the first HTS strap.

6. The two-sided joint of claim 1, wherein the first HTS strap and the backing strap are selected to be about 90% to about 105% of the width of each of the first laminated HTS wire and the second laminated HTS wire.

7. The two-sided joint of claim 1 wherein the backing strap is selected such that a first load to impart a 0.5% tensile strain in the backing strap is within a 30% to 150% range of a second load required to impart a 0.5% tensile strain to the first HTS strap.

8. The two-sided joint of claim 1, wherein the backing strap and the first HTS strap are selected such that a first load required to impart 0.5% tensile strain in the backing strap and the first HTS strap combined is less than a second load required to impart 0.5% strain in either of the first laminated wire or the second laminated HTS wire.

9. The two-sided joint of claim 1, wherein the electrical communication comprises a metal or alloy with a melting temperature below 240 degrees C.

10. The two-sided joint of claim 1, wherein the electrical communication comprises a metal or alloy with an ambient temperature resistivity below 50 micro-ohm-cm.

11. The two-sided joint of claim 1, wherein the electrical communication is a metal or alloy containing any one of Pb, Sn, Ag, Cu or In.

12. The two-sided joint of claim 1, wherein the backing strap comprises a second HTS strap.

13. The two-sided joint of claim 12, wherein the second HTS strap comprises a substrate layer, a buffer layer overlaying the substrate layer, a superconductor layer overlaying the buffer layer, and a gap layer overlaying the superconductor layer, wherein the gap layer is adjacent to and in electrical communication with the first laminate layer of the first laminated HTS wire and the first laminate layer of the second laminated HTS wire.

14. The two-sided joint of claim 13, wherein the second HTS strap further comprises a laminate layer proximate to the substrate layer.

15. The two-sided joint of claim 14, wherein the second HTS strap further comprises a second laminate layer interposed between the electrically conductive gap layer and the first and second HTS wires.

16. The two-sided joint of claim 12, wherein the first laminated HTS wire and the second laminated HTS wire each further comprise a non-laminated HTS wire interposed between the first laminate layer and the substrate layer, wherein the non-laminated HTS wire comprises a second gap layer overlaying the first laminate layer, a second HTS film layer overlaying the gap layer, a second buffer layer overlaying the second HTS film layer, and a second substrate layer overlaying the second buffer layer, wherein the gap layer of the non-laminated HTS wire is in electrical communication with the first laminate layer.

17. The two-sided joint of claim 16, wherein the second HTS strap is in electrical communication with the first laminate layer.

18. The two-sided joint of claim 1, wherein the backing strap comprises a metal or alloy containing aluminum, zinc, copper, silver, nickel, iron, chrome, lead, silver or molybdenum.

19. The two-sided joint of claim 1, wherein the first laminated HTS wire and the second laminated HTS wire each have a thickness greater than or equal to about 250 micrometers.

20. The two-sided joint of claim 1, wherein the first laminated HTS wire and the second laminated HTS wire each have a thickness greater than or equal to about 300 micrometers.

21. The two-sided joint of claim 1, wherein the first HTS strap has a thickness of less than about 250 micrometers.

22. The two-sided joint of claim 1, wherein the first HTS strap has a thickness from about 50 micrometers to about 200 micrometers.

23. The two-sided joint of claim 1, wherein the length of the first HTS strap is between about 2% to about 70% longer than the length of the backing strap.

24. The two-sided joint of claim 1, wherein the length of the first HTS strap is about 20% to about 50% longer than the length of the backing strap.

25. The two-sided joint of claim 1, wherein the angle of each of the tapered first ends relative to the thick laminated wire ranges from about 3 degrees to about 50 degrees.

26. The two-sided joint of claim 1, wherein each of the tapered ends has a length from about 0.4 cm to about 10 cm.

27. The two-sided joint of claim 1, wherein the HTS strap has a length from about 2 cm to 26 cm.

28. The two-sided joint of claim 1, wherein the HTS strap has a length from about 5 cm to 26 cm.

29. The two-sided joint of claim 1, wherein the backing strap has a length from about 6 cm to about 16 cm.

30. The two-sided joint of claim 1, wherein the backing strap has a length of about 1.5 cm to 25 cm.

31. The two-sided joint of claim 1, wherein at least one laminate layer of each laminated wire is selected from a material consisting of brass, stainless steel, copper or alloys containing zinc, lead, silver, tin, nickel, iron, and aluminum.

32. The two-sided joint of claim 1, wherein the resistance through the joint is less than 3.0 micro ohms in the 77 K to 293 K temperature range.

33. A two-sided joint of claim 1, wherein bending the two-sided joint on a diameter of 10 cm or less does not produce a physical kink in the joint.

34. A two-sided joint of claim 1, wherein bending the joint on a diameter of 10 cm or less does not reduce critical current by more than 15%.

35. A two-sided joint of claim 1, wherein bending the joint on a diameter of 10 cm or less does not increase joint resistance by more than 5%.

36. A two-sided joint of claim 1, wherein spiral winding the two-sided joint onto a former, wherein the former has a diameter 5 cm or less, with an axial tension in the first and second thick laminated wires of between about 0.1 kg to 7 kg and a pitch of at least 65 mm such that a gap between the two-sided joint and former is less than 1.5 mm.

37. A two-sided joint for an HTS laminated wire comprising:
    a first laminated HTS wire having a tapered first end across the width of the first laminated HTS wire and comprising a first laminate layer, a substrate layer overlaying the first laminate layer, a HTS film layer overlaying the substrate layer; and a second laminate layer overlaying the HTS film layer;
    a second laminated HTS wire having a tapered first end across the width of the second laminated HTS wire and comprising a first laminate layer, a substrate layer overlaying the first laminate layer, a HTS film layer overlaying the substrate layer, and a second laminate layer overlaying the HTS film layer, and wherein the tapered first end of the first laminated HTS wire is adjacent to and mated with the angled tapered end of the second laminated HTS wire;

an upper support in electrical communication with the second laminate layer of the first laminated HTS wire and the second laminate layer of the second laminated HTS wire; and a lower support proximate to the first laminate layer of the first laminated HTS wire and the first laminate layer of the second laminated HTS wire, wherein at least one of a length and an amount of laminate in at least one of the supports is selected to provide a neutral axis for the HTS films in the first laminated HTS wire and the second laminated HTS wire.

38. A two-sided joint for a HTS laminated wire comprising:

a first laminated HTS wire having a tapered first end and comprising a first laminate layer, a substrate layer overlaying the first laminate layer, a HTS film layer overlaying the substrate layer; and a second laminate layer overlaying the HTS film layer;

a second laminated HTS wire having a tapered first end and comprising a first laminate layer, a substrate layer overlaying the first laminate layer, a HTS film layer overlaying the substrate layer, and a second laminate layer overlaying the HTS film layer, and wherein the tapered first end of the first laminated HTS wire is adjacent to and mated with the tapered end of the second laminated HTS wire;

a first HTS strap in electrical communication with the second laminate layer of the first laminated HTS wire and the second laminate layer of the second laminated HTS wire; and a backing strap proximate to the first laminate layer of the first laminated HTS wire and the first laminate layer of the second laminated HTS wire, wherein the materials and dimensions of the joint are selected to avoid at least one of kinking, delamination, and degradation of the HTS wires.

39. A superconducting cable comprising:

a former; and a plurality of HTS wires, wherein at least one wire has one or more two-sided joints and one or more gaps between the each of the two-sided joint and the former, wherein the one or more two-sided joint comprises:

a first laminated HTS wire having a tapered first end across the width of the first laminated HTS wire and comprising a first laminate layer, a substrate layer overlaying the first laminate layer, a HTS film layer overlaying the substrate layer; and a second laminate layer overlaying the HTS film layer;

a second laminated HTS wire having a tapered first end across the width of the second laminated HTS wire and comprising a first laminate layer, a substrate layer overlaying the first laminate layer, a HTS film layer overlaying the substrate layer, and a second laminate layer overlaying the HTS film layer, and wherein the tapered first end of the first laminated HTS wire is adjacent to and mated with the angled tapered end of the second laminated HTS wire;

an upper support in electrical communication with second laminate layer of the first laminated HTS wire and the second laminate layer of the second laminated HTS wire; and a lower support proximate to the first laminate layer of the first laminated HTS wire and the first laminate layer of the second laminated HTS wire.

40. The superconducting cable of claim 39, wherein the former has a diameter of 5 cm or less.

41. The superconducting cable of claim 39, wherein the gap is less than 1.5 mm.

42. The superconducting cable of claim 39, wherein the plurality of wires are spirally wound around the former at an axial tension between about 1 kg to about 5 kg and a pitch of 65 mm or greater.

43. A method of winding a superconducting wire comprising:

splicing one or more HTS wires to form one or more two-sided joints;

wrapping the one or more HTS wires around a former in a spiral pattern; and creating a gap between the two side joint and the former, wherein the one or more two-sided joint comprises:

a first laminated HTS wire having a tapered first end across the width of the first laminated HTS wire and comprising a first laminate layer, a substrate layer overlaying the first laminate layer, a HTS film layer overlaying the substrate layer; and a second laminate layer overlaying the HTS film layer;

a second laminated HTS wire having a tapered first end across the width of the second laminated HTS wire and comprising a first laminate layer, a substrate layer overlaying the first laminate layer, a HTS film layer overlaying the substrate layer, and a second laminate layer overlaying the HTS film layer, and wherein the tapered first end of the first laminated HTS wire is adjacent to and mated with the angled tapered end of the second laminated HTS wire;

an upper support in electrical communication with second laminate layer of the first laminated HTS wire and the second laminate layer of the second laminated HTS wire; and a lower support proximate to the first laminate layer of the first laminated HTS wire and the first laminate layer of the second laminated HTS wire.

44. The method of winding a superconducting wire of claim 43, wherein the plurality of wires are spirally wound around the former at an axial tension between about 1 kg to about 5 kg and a pitch of 65 mm or greater.

45. The method of winding a superconducting wire of claim 43, wherein the gap is less than about 1.5 mm.

* * * * *